United States Patent
Kurashima

(10) Patent No.: US 8,482,301 B2
(45) Date of Patent: Jul. 9, 2013

(54) ELECTROSTATIC CAPACITANCE INPUT DEVICE AND ELECTRO-OPTICAL DEVICE HAVING INPUT DEVICE

(75) Inventor: Takashi Kurashima, Nagano (JP)

(73) Assignee: Japan Display West Inc., Aichi-Ken (JP)

( * ) Notice: Subject to any disclaimer, the term of this patent is extended or adjusted under 35 U.S.C. 154(b) by 223 days.

(21) Appl. No.: 12/839,790

(22) Filed: Jul. 20, 2010

(65) Prior Publication Data
US 2011/0018560 A1 Jan. 27, 2011

(30) Foreign Application Priority Data

Jul. 27, 2009 (JP) ................ P2009-173984

(51) Int. Cl.
*G01R 27/26* (2006.01)
*G06F 3/041* (2006.01)
(52) U.S. Cl.
USPC .......................................... 324/658; 345/173
(58) Field of Classification Search
USPC ........................................................ 345/173
See application file for complete search history.

(56) References Cited

U.S. PATENT DOCUMENTS

| 5,149,919 | A | * | 9/1992 | Greanias et al. | ........... 178/18.02 |
| 5,457,289 | A | * | 10/1995 | Huang et al. | ............... 178/18.08 |
| 5,548,306 | A | * | 8/1996 | Yates et al. | ..................... 345/174 |
| 7,030,860 | B1 | | 4/2006 | Hsu et al. | |
| 7,339,579 | B2 | * | 3/2008 | Richter et al. | ................ 345/173 |
| 7,633,566 | B2 | * | 12/2009 | Utsunomiya et al. | ........... 349/12 |
| 8,194,044 | B2 | * | 6/2012 | Richter et al. | ................. 345/173 |
| 2006/0022682 | A1 | * | 2/2006 | Nakamura et al. | ............ 324/681 |
| 2008/0231607 | A1 | * | 9/2008 | Utsunomiya et al. | ......... 345/173 |

FOREIGN PATENT DOCUMENTS

| JP | 2003-511799 | 3/2003 |
| JP | 2005-337773 | 12/2005 |
| JP | 2008-090623 | 4/2008 |
| JP | 2009-086240 | 4/2009 |

OTHER PUBLICATIONS

Japanese Office Action issued Mar. 12, 2013 for corresponding Japanese Appln. No. 2009-173984.

\* cited by examiner

*Primary Examiner* — Jeff Natalini
(74) *Attorney, Agent, or Firm* — K&L Gates LLP

(57) ABSTRACT

Disclosed herein is an electrostatic capacitance input device including: an input region of a substrate, in which a plurality of input position detection electrodes are provided; a plurality of wires that are electrically connected to the plurality of input position detection electrodes and extend outside the input region of the substrate; and a shield electrode that overlaps the wires on the input operation side.

7 Claims, 19 Drawing Sheets

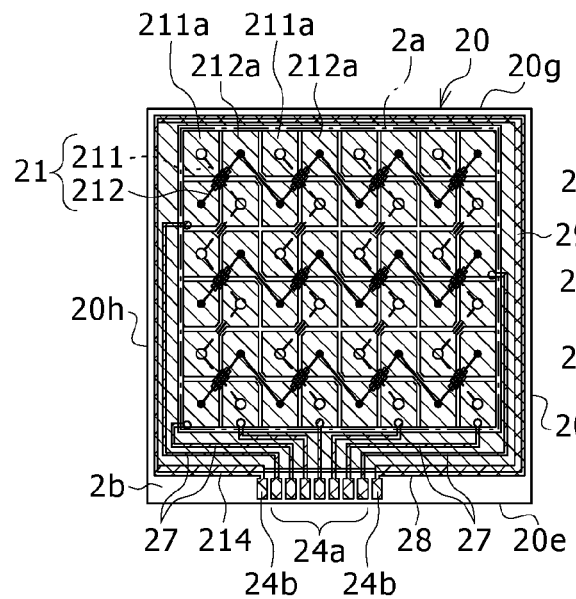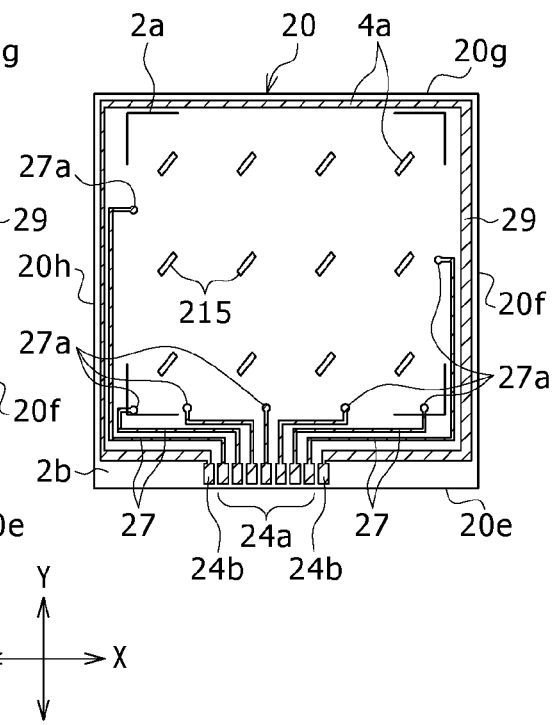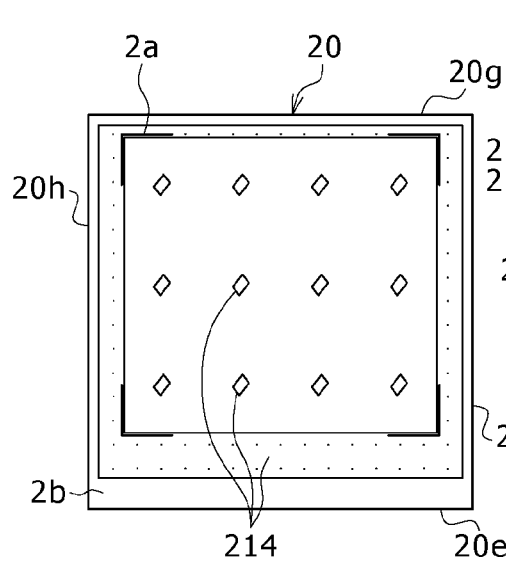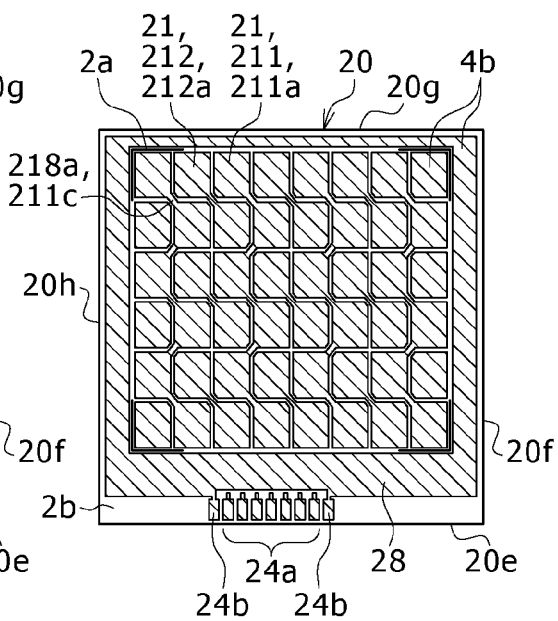

ELECTROSTATIC CAPACITANCE INPUT DEVICE AND ELECTRO-OPTICAL DEVICE HAVING INPUT DEVICE

CROSS REFERENCES TO RELATED APPLICATIONS

The present application claims priority to Japanese Priority Patent Application JP 2009-173984 filed in the Japan Patent Office on Jul. 27, 2009, the entire content of which is hereby incorporated by reference.

BACKGROUND

The present application relates to an electrostatic capacitance input device for detecting an input position based on the change in electrostatic capacitance connected to input position detection electrodes and an electro-optical device equipped with an input device having the electrostatic capacitance input device.

Some of electronic equipment such as mobile phones, car navigators, personal computers, ticket vendors and bank terminals incorporate an input device called a touch panel, for example, on the surface of a liquid crystal device so that one can enter information as one views an image displayed on an image display region of the liquid crystal device. An electrostatic capacitance input device is among such types of input devices and monitors the electrostatic capacitance connected to each of a plurality of input position detection electrodes. Therefore, when a finger approaches one of the plurality of input position detection electrodes, the electrostatic capacitance connected to the electrode in question increases by the amount of electrostatic capacitance formed between the electrode and finger, thus allowing for the electrode in question to be identified.

Such an electrostatic capacitance input device is susceptible to electromagnetic noise because it detects the changes in capacitance coupled to the input position detection electrodes. For this reason, it has been proposed to provide a shield electrode over the entire surface of the side opposite to the input operation side of the electrostatic capacitance input device (see JP-T-2003-511799, hereinafter referred to as Patent Document 1).

SUMMARY

However, the shield structure described in Patent Document 1 has a problem in that it cannot shut out electromagnetic noise trying to find its way into the electrostatic capacitance input device from the input operation side.

In light of the foregoing, it is desirable to provide an electrostatic capacitance input device and an electro-optical device equipped with an input device having the electrostatic capacitance input device that are more immune to electromagnetic noise trying to find its way into the electrostatic capacitance input device from the input operation side.

In order to solve the above problem, an electrostatic capacitance input device according to an embodiment of the present application is characterized in that it includes an input region, a plurality of wires and a shield electrode. A plurality of input position detection electrodes are provided in the input region of a substrate. The plurality of wires are electrically connected to the plurality of input position detection electrodes and extend outside the input region of the substrate. The shield electrode overlaps the wires on the input operation side.

The present application breaks away from the existing idea that a shield electrode cannot be provided on the input operation side of an electrostatic capacitance input device. Therefore, a shield electrode is provided on the input operation side for wires provided outside the input region. This shuts out electromagnetic noise trying to find its way into the wires from the input operation side, thus ensuring immunity to electromagnetic waves trying to find their way from the input operation side. Therefore, the electrostatic capacitance input device according to an embodiment of the present application is unlikely to malfunction due to electromagnetic noise. No shield electrode is provided in the input region on the input operation side, thus posing no hindrance to input position detection based on electrostatic capacitance.

In the present application, the shield electrode should preferably be provided all along the outer periphery of the substrate. This configuration more positively shuts out electromagnetic waves from the input operation side.

In the present application, a first conductive film, interlayer insulating film and second conductive film should preferably be formed in this order from the substrate side on the substrate. Of the first and second conductive films, at least either of the two conductive films should preferably be used to form the input position detection electrodes. Of the first and second conductive films, the conductive film on the side opposite to the input operation side should preferably be used to form the wires. Of the first and second conductive films, the conductive film on the input operation side should preferably be used to form the shield electrode. This configuration permits formation of the shield electrode with the conductive film formed on the substrate, thus eliminating the need to provide a shield electrode externally.

In an embodiment, of the first and second conductive films, the conductive film on the side opposite to the input operation side should preferably be used to form a shielding auxiliary electrode on the outer periphery side of the wires on the substrate. The shielding auxiliary electrode and shield electrode should preferably overlap and be electrically connected together in the region free from the interlayer insulating film. This configuration provides substantially reduced resistance of the shield electrode. Further, this configuration suppresses electromagnetic noise from finding its way into the wires from the surrounding environment.

In an embodiment, the shielding auxiliary electrode should preferably be formed along all the sides of the substrate, and the shielding auxiliary electrode and shield electrode should preferably overlap and be electrically connected together all along the longitudinal direction of the shielding auxiliary electrode. This configuration provides substantially reduced resistance of the shield electrode. Further, this configuration more positively suppresses electromagnetic noise from finding its way into the wires from the surrounding environment.

In an embodiment, of the first and second conductive films, at least either of the two conductive films should preferably be used to provide first and second mounting terminals outside the input region of the substrate. The first mounting terminals should preferably be connected to the wires, and the second mounting terminals to the shield electrode. This configuration permits external application of a potential to the shield electrode, for example, via a flexible wiring board connected to the substrate as with the first mounting terminals, thus allowing for easy application of a potential to the shield electrode. Further, this configuration permits connection of a common flexible wiring board to the first and second mounting terminals.

In an embodiment, of the first and second conductive films, at least either of the two conductive films should preferably be used to provide, on the substrate, a plurality of first input position detection electrodes and a plurality of second input position detection electrodes as the input position detection electrodes. The first input position detection electrodes extend in a first direction in an in-plane direction of the substrate. The second input position detection electrodes extend in a second direction that intersects the first direction in the in-plane direction of the substrate. A junction portion, interruption portion and relay electrode should preferably be provided at each of the intersecting portions between the first and second input position detection electrodes. The junction portion allows for one of the first and second input position detection electrodes to be continuous and includes the one of the first and second conductive films. The interruption portion is a portion where the other of the first and second input position detection electrodes is interrupted. The relay electrode overlaps the junction portion via the interlayer insulating film to electrically connect the interruption portion of the other of the first and second input position detection electrodes. The relay electrode includes the other of the first and second conductive films.

In an embodiment, the first conductive film, interlayer insulating film and second conductive film can be formed on a substrate surface on the input operation side of the substrate. The wires can be formed with the first conductive film, and the shield electrode with the second conductive film.

In an embodiment, the first conductive film, interlayer insulating film and second conductive film may be formed on the surface of the substrate on the side opposite to the input operation side. The wires may be formed with the second conductive film, and the shield electrode with the first conductive film.

In an embodiment, a signal having the same waveform and phase as a position detection signal applied to the input position detection electrodes should preferably be applied to the shield electrode. This configuration ensures freedom from parasitic capacitance between the shield electrode and input position detection electrodes.

The electrostatic capacitance input device to which the present application is applied is used to make up an electro-optical device equipped with an input device. In the electro-optical device equipped with an input device, an electro-optical panel adapted to generate an image is formed on the side opposite to the input operation side with respect to the substrate.

The electro-optical device equipped with an input device to which the present application is applied is used, for example, for mobile phones, car navigators, personal computers, ticket vendors and bank terminals.

Additional features and advantages are described herein, and will be apparent from the following Detailed Description and the figures.

BRIEF DESCRIPTION OF THE FIGURES

FIGS. 10A to 10D are explanatory diagrams schematically illustrating the two-dimensional configuration of the electrostatic capacitance input device according to embodiment 3;

DETAILED DESCRIPTION

The present application will be described below with reference to the accompanying drawings according to an embodiment. It should be noted that, in the figures referred to in the description given below, the layers and members are plotted on different scales so that they are shown in recognizable sizes. The basic configuration common to all the embodiments will be described first. Then, a detailed description will be made of each of the embodiments.

[Basic Configuration]

(Overall Configuration of the Electro-Optical Device Equipped with an Input Device)

Figure 1A:
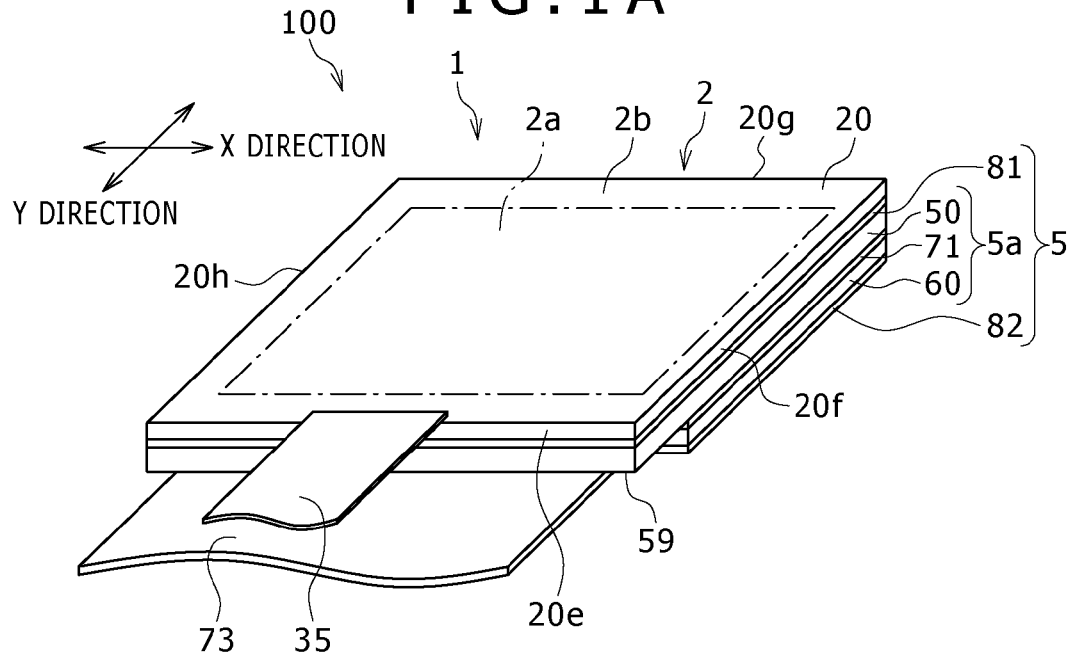
FIGS. 1A to 1C are explanatory diagrams of an electrostatic capacitance input device of an embodiment.
Figure 1B:
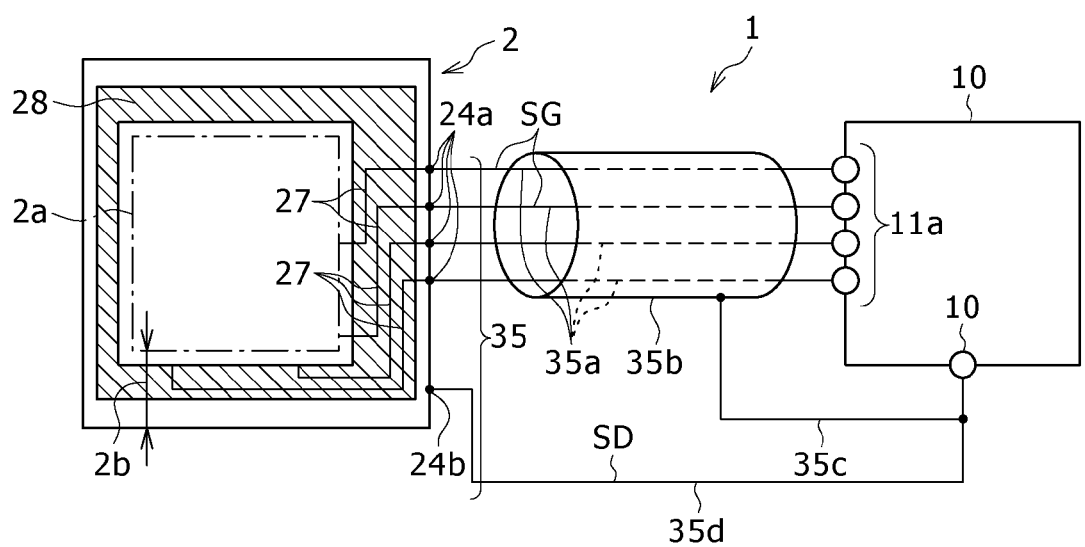
Figure 1C:
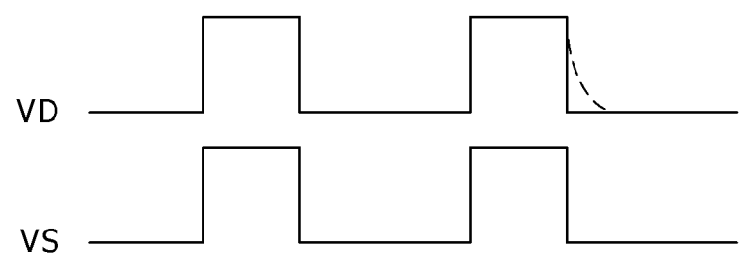
Figure 2A:
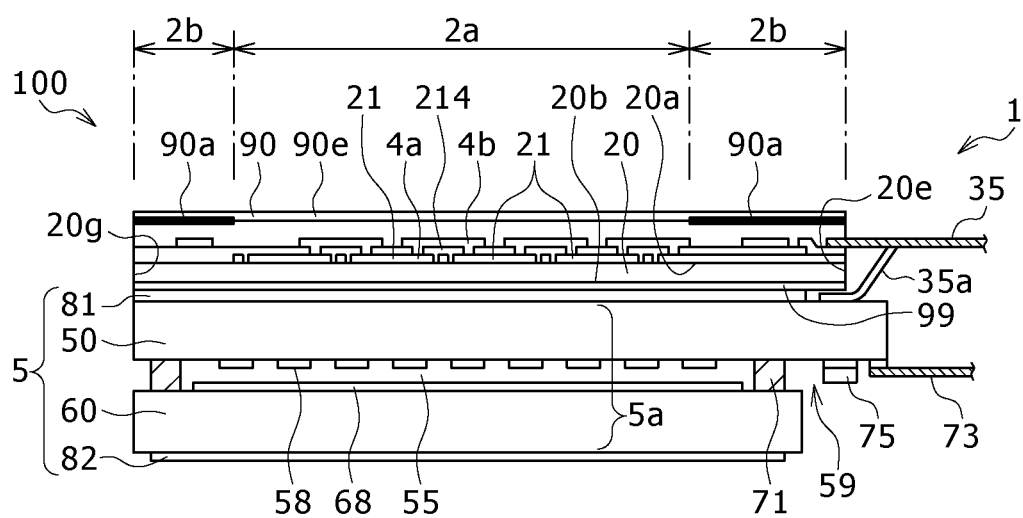
FIGS. 2A and 2B are explanatory diagrams schematically illustrating the cross-sectional configuration of electro-optical device equipped with an input device of an embodiment.
Figure 2B:
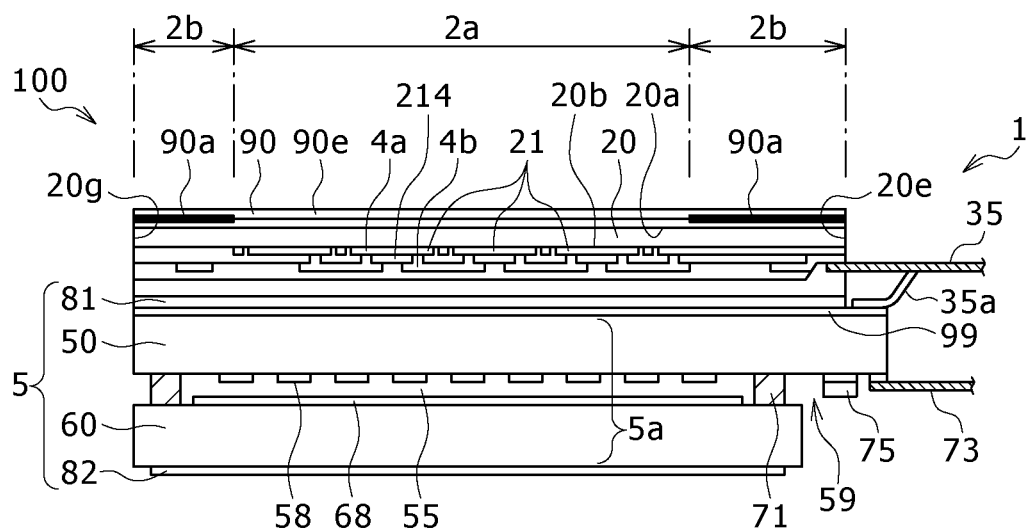

FIGS. 1A to 1C are explanatory diagrams of an electrostatic capacitance input device to which the present application is applied. FIG. 1A is an explanatory diagram schematically illustrating the overall configuration of an electro-optical device equipped with an input device having the electrostatic capacitance input device according to the present embodiment. FIG. 1B is an explanatory diagram schematically illustrating the electrical configuration of the electrostatic capacitance input device. FIG. 1C is an explanatory diagram of potentials supplied to the electrostatic capacitance input device. FIGS. 2A and 2B are explanatory diagrams schematically illustrating the cross-sectional configuration of an electro-optical device equipped with an input device to which the present application is applied. FIG. 2A is an explanatory diagram of a configuration example in which an embodiment of the input position detection electrodes are provided on a first surface that is on the input operation side of the substrate. FIG. 2B is an explanatory diagram of a configuration example in which the input position detection electrodes are provided on a second surface that is on the side opposite to the input operation side of the substrate.

In FIG. 1A, an electro-optical device 100 equipped with an input device according to the present embodiment generally includes an image generating device 5 and electrostatic capacitance input device 1. The image generating device 5 is made up, for example, of a liquid crystal device. The electrostatic capacitance input device 1 is stacked on the surface of the image generating device 5 on the display light emission side. The electrostatic capacitance input device 1 includes an input panel 2 (touch panel). The image generating device 5 includes a liquid crystal panel serving as an electro-optical panel 5a (display panel). In the present embodiment, both the input panel 2 and electro-optical panel 5a are rectangular in plan view. The region at the center of the electrostatic capacitance input device 1 and electro-optical device 100 equipped with an input device as seen in plan view is an input region 2a. On the other hand, the region of the same devices 5 and 100 overlapping the input region 2a as seen in plan view is an image formation region. A flexible wiring board 35 is connected to the input panel 2 on the side of an edge portion 20e. A flexible wiring board 73 is connected to the electro-optical panel 5a on the side of the edge portion 20e.

As illustrated in FIG. 1B, a control IC 10 adapted to detect the input operation on the input panel 2 is electrically connected to the electrostatic capacitance input device 1 via the flexible wiring board 35. A potential which will be described later with reference to FIG. 1C is supplied from the IC 10 to the input panel 2.

In FIGS. 1A, 2A and 2B, the image generating device 5 is a transmissive or semi-transmissive active matrix liquid crystal display device. A backlight device (not shown) is provided on the side opposite to that (side opposite to the display light emission side) on which the input panel 2 is provided. The backlight device includes a light-transmitting light guide plate and light source. The light-transmitting light guide plate is provided on the side of the electro-optical panel 5a opposite to that on which the electrostatic capacitance input device 1 is provided. The light source includes an LED adapted to emit white light toward the side edge portions of the light guide plate. Light emitted from the light source enters the light guide plate from its side edge portions, being emitted toward the electro-optical panel 5a while propagating through the light guide plate. An optical member in a sheet form such as a light-scattering sheet or prism sheet may be arranged between the light guide plate and electro-optical panel 5a.

In the image generating device 5, a first polarizer 81 is stacked on the display light emission side of the electro-optical panel 5a, and a second polarizer 82 on the side of the electro-optical panel 5a opposite to the display light emission side. Therefore, the electrostatic capacitance input device 1 is glued to the first polarizer 81 with a light-transmitting adhesive (not shown) such as acrylic resin-based adhesive. The electro-optical panel 5a includes a light-transmitting element substrate 50 and light-transmitting opposed substrate 60. The light-transmitting element substrate 50 is provided on the display light emission side. The opposed substrate 60 is provided to be opposed to the element substrate 50. The element substrate 50 and opposed substrate 60 are bonded together with a sealing material 71 in the form of a rectangular frame. A liquid crystal layer 55 is held in the region surrounded by the sealing material 71 between the opposed substrate 60 and element substrate 50. A plurality of pixel electrodes 58 are formed on the surface of the element substrate 50 opposed to the opposed substrate 60. The pixel electrodes 58 are formed with a light-transmitting conductive film such as ITO (Indium Tin Oxide) film. A common electrode 68 is formed on the surface of the opposed substrate 60 opposed to the element substrate 50. The common electrode 68 is formed with a light-transmitting conductive film such as ITO (Indium Tin Oxide) film. It should be noted that if the image generating device 5 is an IPS (In Plane Switching) or FFS (Fringe Field Switching) device, the common electrode 68 is provided on the element substrate 50. On the other hand, the element substrate 50 may be provided on the display light emission side. In the element substrate 50, a drive IC 75 is COG-mounted in an overhanging section 59 hanging over the edge of the opposed substrate 60. Further, a flexible wiring board 73 is connected to the overhanging section 59. It should be noted that drive circuits may be formed on the element substrate 50 concurrently with switching elements on the same substrate 50.

In the electro-optical device 100 equipped with an input device configured as described above, a light-transmitting conductive layer 99 (not shown in FIGS. 1A to 1C, refer to FIGS. 2A and 2B) made, for example, of an ITO film is provided between the electro-optical panel 5a and input panel 2. The conductive layer 99 prevents electromagnetic noise emitted from the electro-optical panel 5a from entering the input panel 2.

(Detailed Configuration of the Input Device 1)

In the electrostatic capacitance input device 1 illustrated in FIGS. 2A and 2B, the input panel 2 includes a light-transmitting substrate 20 made, for example, of a glass or plastic plate. In the present embodiment, a glass substrate is used as the substrate 20. It should be noted that when the substrate 20 includes a plastic material, a heat-resistant and light-transmitting sheet made of PET (polyethylene terephthalate), PC (polycarbonate), PES (polyethersulphone), PI (polyimide) or cyclic olefin resin such as polynorbornene can be used as the plastic material. A description will be given below assuming that the surface of the substrate 20 on the input operation side is a first surface 20a and that the surface thereof on the side opposite to the input operation side is a second surface 20b.

In the configuration example of the electrostatic capacitance input device 1 shown in FIG. 2A of the two examples illustrated in FIGS. 2A and 2B, a first conductive film 4a, interlayer insulating film 214 and second conductive film 4b are formed, from bottom to top as seen from the substrate 20, on the first surface 20a of the substrate 20. Input position detection electrodes 21 are formed with at least one of the first and second conductive films 4a and 4b. The flexible wiring board 35 is connected to the first surface 20a on the edge portion 20e of the substrate 20. A light-transmitting and insulating cover 90 is glued to the first surface 20a of the substrate 20, for example, with an adhesive 90e. An insulating light-shielding layer 90a is printed in the region of the cover 90 overlapping an outer region 2b on the first surface 20a of the substrate 20. The input region 2a is surrounded by the light-shielding layer 90a. The light-shielding layer 90a overlaps the outer region of the electro-optical panel 5a, shutting out light leaking from the light source and the edge portions of the light guide of the image generating section 5.

On the other hand, the light-transmitting conductive layer 99 is formed roughly over the entire second surface 20b of the substrate 20 to prevent electromagnetic noise emitted from the electro-optical panel 5a from entering the input panel 2. Wires 35a of the flexible wiring board 35 are connected to the conductive layer 99, thus allowing a shield potential, which will be described later, to be applied to the conductive layer 99 via the flexible wiring board 35.

In the configuration example shown in FIG. 2B, the first conductive film 4a, interlayer insulating film 214 and second conductive film 4b are formed, from bottom to top as seen from the substrate 20, on the second surface 20a of the substrate 20, as described in detail later. Of the first and second conductive films 4a and 4b, at least one of the two films is used to form the input position detection electrodes 21. In this configuration, the flexible wiring board 35 is connected to the second surface 20b on the edge portion 20e of the substrate 20. In the present embodiment, the light-transmitting and insulating cover 90 is also glued to the first surface 20a of the substrate 20, for example, with the adhesive 90e. The insulating light-shielding layer 90a is printed in the region of the cover 90 overlapping the outer region 2b on the first surface 20a of the substrate 20.

On the other hand, the light-transmitting conductive layer 99 is formed roughly over the entire surface of the element substrate 50 on the side of the input panel 2 to prevent electromagnetic noise emitted from the electro-optical panel 5a from entering the input panel 2. The wires 35a of the flexible wiring board 35 are connected to the conductive layer 99, thus allowing the shield potential, which will be described later, to be applied to the conductive layer 99 via the flexible wiring board 35

A description will be given below of examples, as embodiments 1, 2 and 3, in which the present application is applied to the embodiments of forming the first conductive film 4a, interlayer insulating film 214 and second conductive film 4b on the first surface 20a of the substrate 20 (embodiment shown in FIG. 2A). On the other hand, a description will be given below of examples, as embodiments 4 and 5, in which the present application is applied to the embodiments of forming the first conductive film 4a, interlayer insulating film 214 and second conductive film 4b on the second surface 20b of the substrate 20 (embodiment shown in FIG. 2B).

Embodiment 1

Figure 3A:
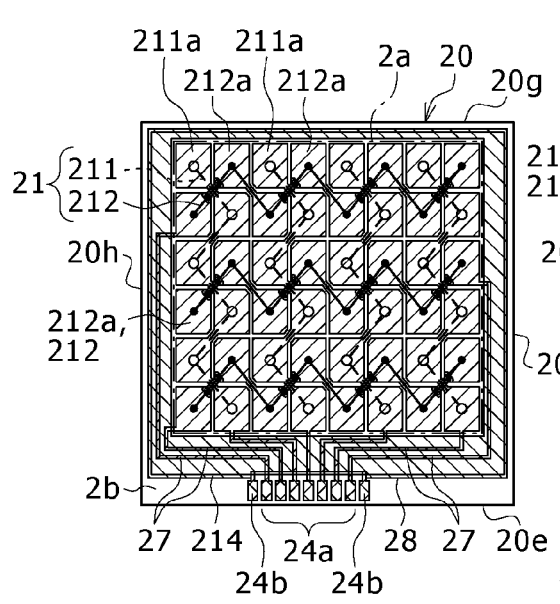
FIGS. 3A to 3D are explanatory diagrams schematically illustrating the two-dimensional configuration of the electrostatic capacitance input device according to embodiment 1.
Figure 3B:
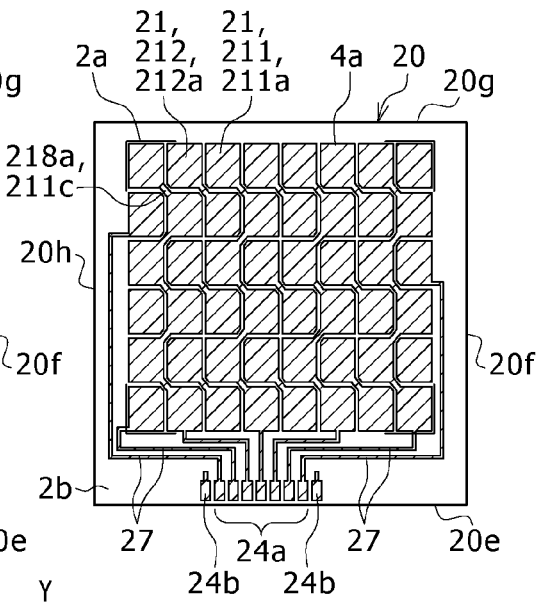
Figure 3C:
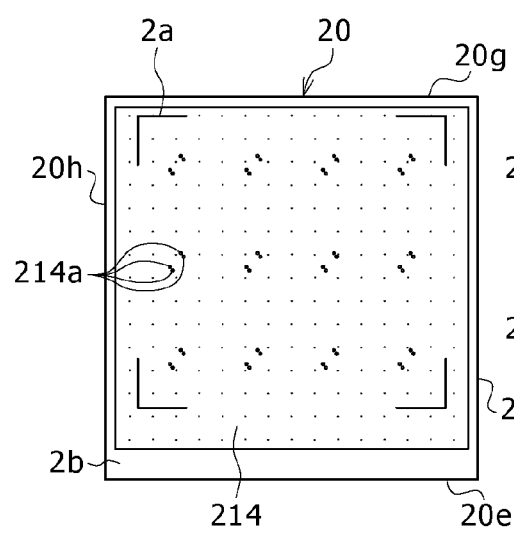
Figure 3D:
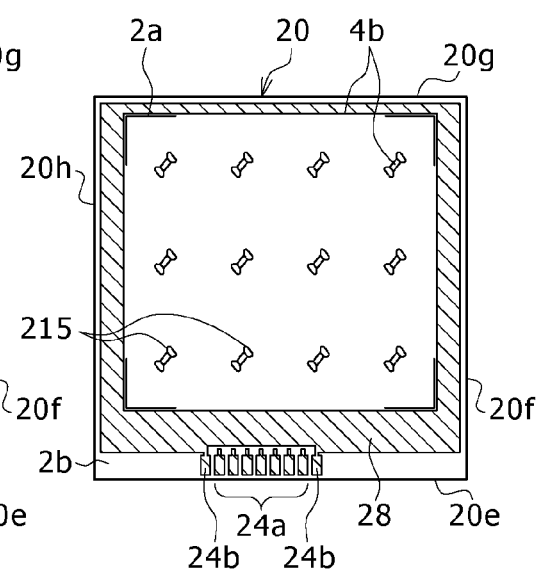

A description will be given below of the type of the electrostatic capacitance input device 1, described with reference to FIG. 2A, with reference to FIGS. 3A to 6C. FIGS. 3A to 3D are explanatory diagrams schematically illustrating the two-dimensional configuration of the electrostatic capacitance input device 1 according to embodiment 1 of the present application. FIG. 3A is an explanatory diagram illustrating the two-dimensional positional relationship between the electrodes and other components formed on the substrate 20 of the electrostatic capacitance input device 1. FIG. 3B is an explanatory diagram illustrating the two-dimensional configuration of the first conductive film 4a formed on the substrate 20. FIG. 3C is an explanatory diagram illustrating the two-dimensional configuration of the interlayer insulating film 214 formed on the substrate 20. FIG. 3D is an explanatory diagram illustrating the two-dimensional configuration of the second conductive film 4b formed on the substrate 20. FIG. 3A illustrates the elements shown in FIGS. 3B, 3C and 3D in an overlapping fashion.

Figure 4:
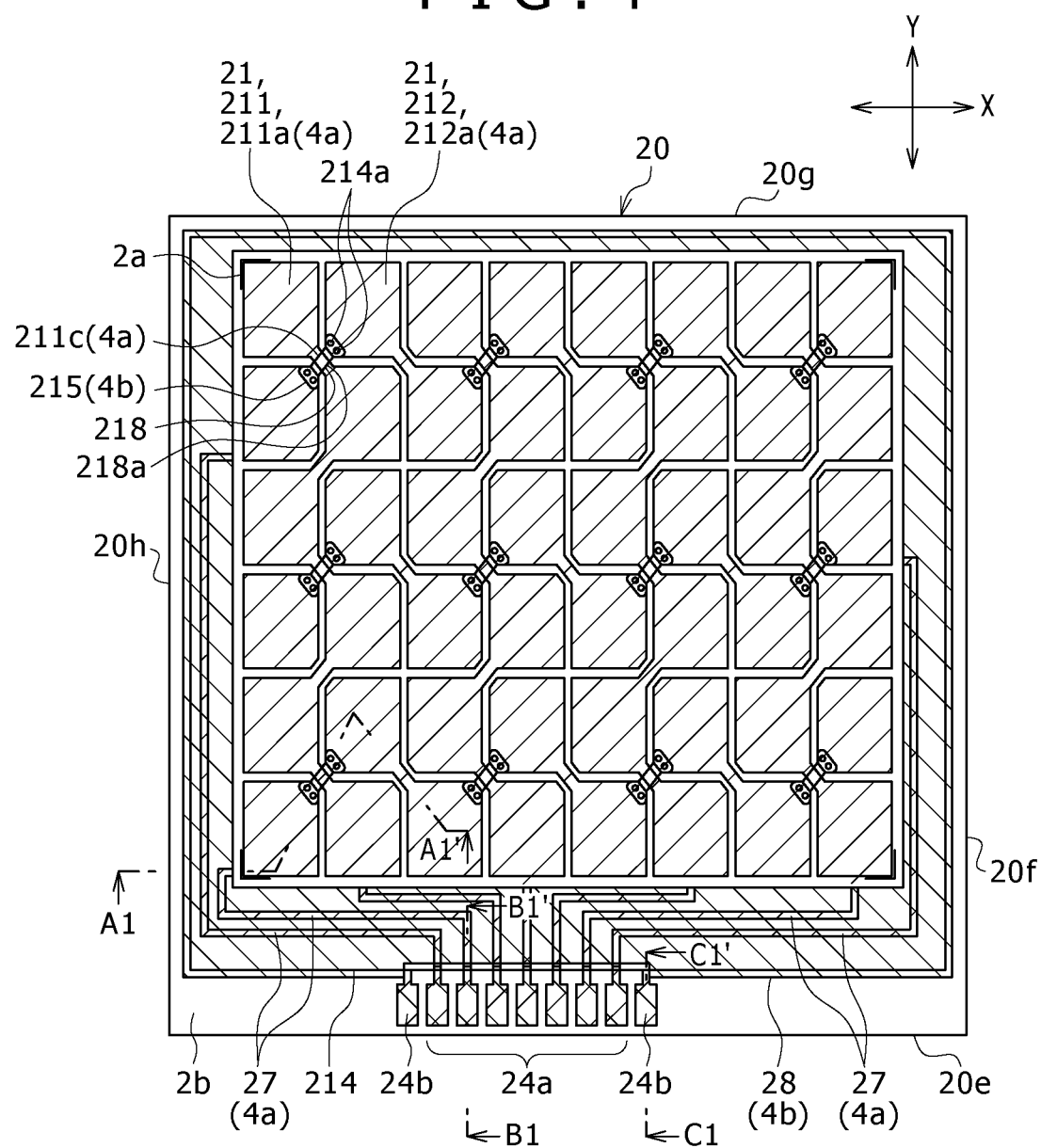
FIG. 4 is an explanatory diagram illustrating, in an enlarged fashion, the two-dimensional configuration of electrodes and other components formed on a substrate of the electrostatic capacitance input device according to embodiment 1.
Figure 5A:
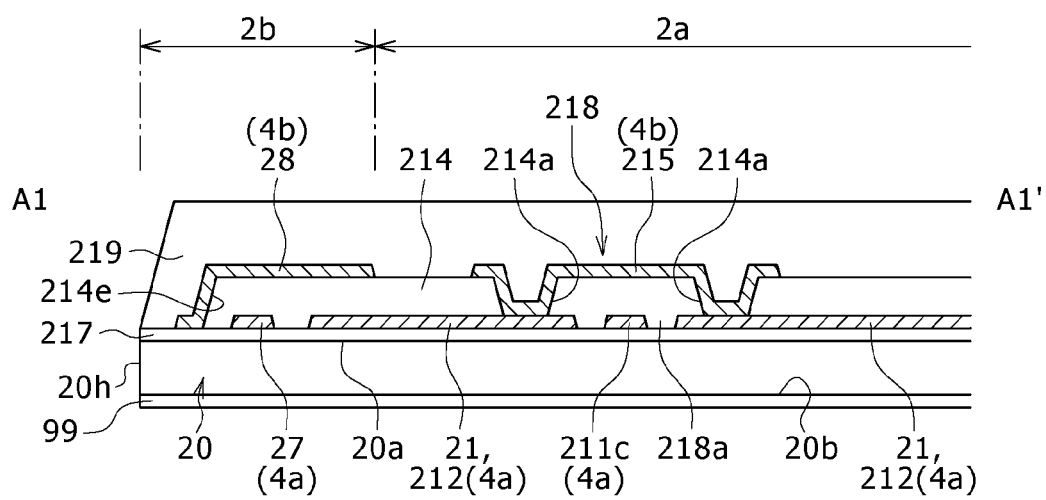
FIGS. 5A to 5C are explanatory diagrams illustrating the cross-sectional configuration of the substrate of the electrostatic capacitance input device according to embodiment 1.
Figure 5B:
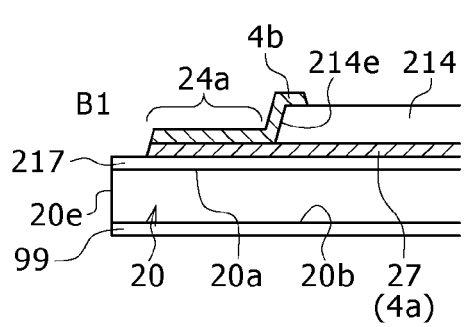
Figure 5C:
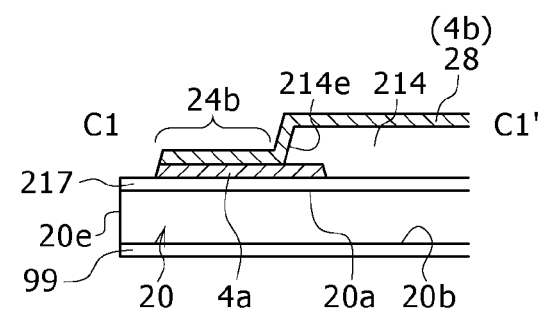
Figure 6A:
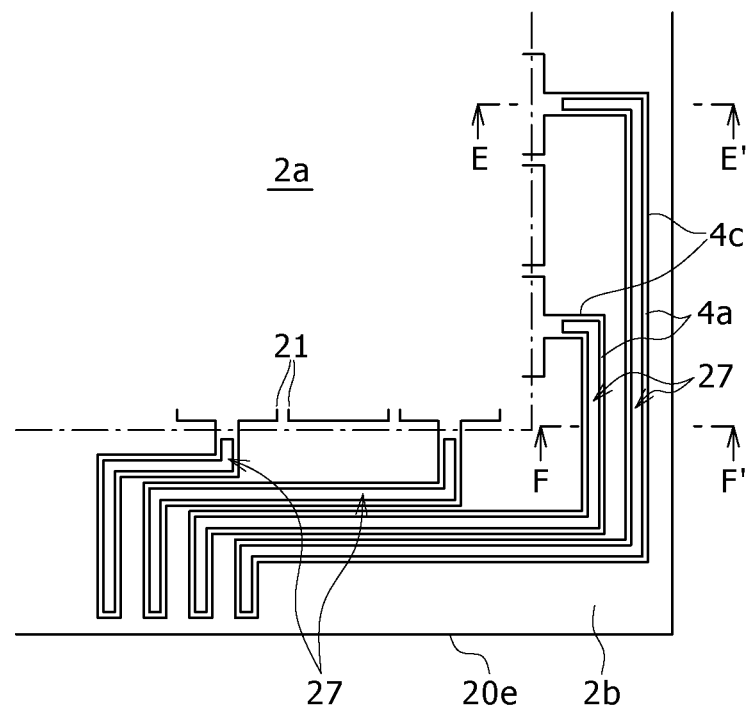
FIGS. 6A to 6C are explanatory diagrams illustrating the configuration of wires formed on the substrate of the electrostatic capacitance input device according to embodiment 1.
Figure 6B:
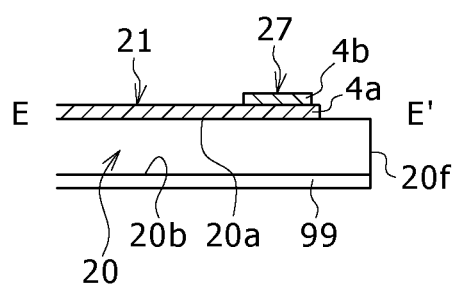
Figure 6C:
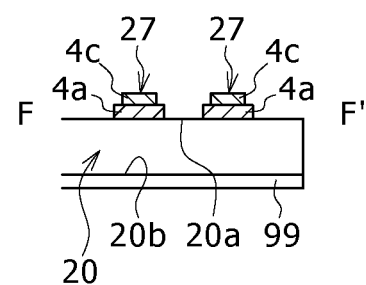

FIG. 4 is an explanatory diagram illustrating, in an enlarged fashion, the two-dimensional configuration of the electrodes and other components formed on the substrate 20 of the electrostatic capacitance input device 1 according to embodiment 1 of the present application. FIGS. 5A to 5C are explanatory diagrams illustrating the cross-sectional configuration of the substrate 20 of the electrostatic capacitance input device 1 according to embodiment 1 of the present application. FIGS. 5A, 5B and 5C are cross-sectional views of the substrate 20 taken along lines A1-A1', B1-B1' and C1-C1' respectively shown in FIG. 4. FIGS. 6A to 6C are explanatory diagrams illustrating the configuration of wires formed on the substrate 20 of the electrostatic capacitance input device 1 according to embodiment 1 of the present application. FIGS. 6A, 6B and 6C are a plan view of the wires and cross-sectional views thereof taken along lines E-E' and F-F', respectively.

It should be noted that the first conductive film 4a is shaded with oblique lines sloping upward to the right, and the second conductive film 4b with oblique lines sloping downward to the right in FIGS. 3A, 3B, 3D and 4. In FIG. 3C, the interlayer insulating film 214 is shaded with a plurality of dots. In FIGS. 3B, 3C, 3D and 4, the corners of the input region 2a are shown with markings in the form of letter L. It should be noted that the same is true for the drawings which will be referred to in embodiments 2 to 5 which will be described later.

As illustrated in FIGS. 3A to 5C, the first conductive film 4a, interlayer insulating film 214 and second conductive film 4b are formed in this order, from bottom to top as seen from the substrate 20, on the second surface 20a of the substrate 20. In the present embodiment, the first and second conductive films 4a and 4b are made of a light-transmitting conductive film of 10 to 40 nm in thickness such as ITO or IZO (Indium Zinc Oxide) film. The interlayer insulating film 214 is made of a light-transmitting insulating film of 40 to 60 nm in thickness such as silicon oxide film. In the present embodiment, a light-transmitting underlying protective film 217 made, for example, of a silicon oxide film is formed over the entire first surface 20a of the substrate 20. The first conductive film 4a, interlayer insulating film 214 and second conductive film 4b are formed in this order on the light-transmitting underlying protective film 217. As described with reference to FIG. 2A, on the other hand, the light-transmitting conductive layer 99 is formed roughly over the entire second surface 20b of the substrate 20 to prevent electromagnetic noise emitted from the electro-optical panel 5a from entering the input panel 2 (refer to FIGS. 5A to 5C).

As illustrated in FIG. 3B, the first conductive film 4a is formed as a plurality of rectangular regions in the input region 2a first. These rectangular regions make up the input position detection electrodes 21 (pad portions 211a and 212a (large area portions) of first and second input position detection electrodes 211 and 212). The pad portions 211a and 212a are arranged alternately in the X and Y directions. In the plurality of pad portions 211a, the same portions 211a diagonally adjacent to each other are partially connected together by a junction portion 211c. In the plurality of pad portions 212a, the same portions 212a diagonally adjacent to each other are also partially connected together by the junction portion 211c. Further, the first conductive film 4a is formed in the outer region 2b of the input region 2a as wires 27 extending from the input position detection electrodes 21. The first conductive film 4a is also formed in a region near the edge portion 20e overlapping first and second mounting terminals 24a and 24b.

As illustrated in FIG. 3C, the interlayer insulating film 214 is formed over the entire input region 2a. Further, the same film 214 is formed over a large region excluding the outer periphery of the substrate 20. Still further, contact holes 214a are formed in the interlayer insulating film 214, with each set containing the four contact holes 214a. Here, the gap between the outer periphery of the interlayer insulating film 214 and the edge portion 20e of the substrate 20 is wider than that between the outer periphery of the interlayer insulating film 214 and other edge portions 20f, 20g and 21h, thus securing a space for forming the first and second mounting terminals 24a and 24b.

As illustrated in FIG. 3D, the second conductive film 4b is formed as relay electrodes 215 in the regions of the input region 2a overlapping the contact holes 214a shown in FIG. 3C. Further, the same film 4b is formed in the outer region 2b of the input region 2a as a shield electrode 28 in the form of a rectangular frame entirely surrounding the input region 2a. Still further, the same film 4b is formed in a region near the edge portion 20e overlapping the first and second mounting terminals 24a and 24b.

When the first conductive film 4a, interlayer insulating film 214 and second conductive film 4b, that are configured as described above, are stacked one on top of another, the substrate 20 is configured as illustrated in FIGS. 3A, 4 and 5A to 5C. When seen in plan view, the substrate 20 has the plurality of input position detection electrodes 21 formed in the input region 2a. In the present embodiment, the input position detection electrodes 21 include the plurality of columns of first and second input position detection electrodes 211 and 212. The first input position detection electrodes 211 (shown by thick solid lines in FIG. 3A) extend in a first direction (direction shown by arrow Y). The second input position detection electrodes 212 (shown by thick dashed lines in FIG. 3A) extend in a second direction (direction shown by arrow X).

Of the first and second conductive films 4a and 4b, the first conductive film 4a is used to form the input position detection electrodes 21 (first and second input position detection electrodes 211 and 212). As a result, the input position detection electrodes 21 are made up of the same layer. On the first surface 20a of the substrate 20, therefore, a plurality of intersecting portions 218 exist between the first and second input position detection electrodes 211 and 212. In the present embodiment, of the first and second input position detection electrodes 211 and 212, the first input position detection electrodes 211 are connected together in the Y direction by the junction portions 211c made of the first conductive film 4a at the intersecting portions 218, thus extending in the Y direction. In contrast, interruption portions 218a are formed at the intersecting portions 218 for the second input position detection electrodes 212. Further, the interlayer insulating film 214, made, for example, of a silicon oxide film, is formed in the overlying layer of the first and second input position detection electrodes 211 and 212. The light-transmitting relay electrodes 215 are formed with the second conductive film 4b in the overlying layer of the interlayer insulating film 214. The same electrodes 215 electrically connect the second input position detection electrodes 212 which is interrupted at the intersecting portions 218 together via the four contact holes 214a of the interlayer insulating film 214. As a result, the second input position detection electrodes 212 are electrically connected together in the X direction. It should be noted that the relay electrodes 215 are never likely to be shorted out because the same electrodes 215 overlap the junction portions 211c via the interlayer insulating film 214.

Each of the first and second input position detection electrodes 211 and 212 configured as described above includes the rectangular pad portion 211a or 212a having a large area in a region sandwiched between the intersecting portions 218. In the first input position detection electrodes 211, the junction portions 211c located at the intersecting portions 218 are narrower than the pad portions 211a and 212a. Further, the relay electrodes 215 are also formed narrower than the pad portions 211a and 212a.

(Configuration of the Wires 27 and Shield Electrode 28)

In the electrostatic capacitance input device 1 according to the present embodiment, the plurality of wires 27 are formed in the outer region 2b of the input region 2a on the first surface 20a of the substrate 20. Each of the same wires 27 extends from one of the first and second input position detection electrodes 211 and 212 to the edge portion 20e of the substrate 20. More specifically, the wires 27 connected to the first input position detection electrodes 211 are routed between the input region 2a and the edge portion 20e of the substrate 20. On the other hand, the wires 27 connected to the second input position detection electrodes 212 extend linearly between the input region 2a and the edge portion 20f or 20h of the substrate 20 first and then are routed between the input region 2a and the edge portion 20e of the substrate 20. In the wires 27 configured as described above, the portions near the edge portion 20e of the substrate 20 include the first mounting terminals 24a. The flexible wiring board 35 described with reference to FIGS. 1A to 1C and 2 is connected to the first mounting terminals 24a.

On the other hand, the shield electrode 28 is formed in a region overlapping the wires 27 in the outer region 2b of the input region 2a on the first surface 20a of the substrate 20. In the present embodiment, of the first and second conductive films 4a and 4b, the second conductive film 4b on the input operation side is used to form the shield electrode 28. The interlayer insulating film 214 is provided between the wires 27 and shield electrode 28.

In the present embodiment, the wires 27 are formed in the regions corresponding to three sides, i.e., one region sandwiched between the input region 2a and the edge portion 20e of the substrate 20, another between the input region 2a and the edge portion 20f of the substrate 20, and still another between the input region 2a and the edge portion 20h of the substrate 20. In contrast, the shield electrode 28 is formed in the form of a rectangular frame connected in the circumferential direction in the regions corresponding to four sides, i.e., one region sandwiched between the input region 2a and the edge portion 20e of the substrate 20, another between the input region 2a and the edge portion 20f of the substrate 20, still another between the input region 2a and the edge portion 20g of the substrate 20, and still another between the input region 2a and the edge portion 20h of the substrate 20. Further, the shield electrode 28 is wider than each of the wires 27. Therefore, the shield electrode 28 is formed in a large region including that in which the wires 27 extend on the input operation side. Still further, the shield electrode 28 hangs over the outer periphery of the interlayer insulating film 214. As a result, the shield electrode 28 covers a side portion 214e of the interlayer insulating film 214.

In the outer region 2b on the first surface 20a of the substrate 20, on the other hand, the two second mounting terminals 24b are formed in such a manner as to sandwich, on both sides, the first mounting terminals 24a arranged in columns. The first mounting terminals 24a are electrically connected to the wires 27, and the second mounting terminals 24b to the shield electrode 28 on both sides of the region where the first mounting terminals 24a are arranged.

(Manufacturing Method of the Substrate 20)

The manufacturing method of the substrate 20 configured as described above will be briefly described while at the same time describing, for example, the configuration of the first and second mounting terminals 24a and 24b. In order to form the substrate 20, a light-transmitting conductive film is formed first that makes up the first conductive film 4a. Then, the light-transmitting conductive film is patterned by etching as illustrated in FIG. 3B, thus forming the input position detection electrodes 21 (first and second input position detection electrodes 211 and 212) and wires 27.

Next, the interlayer insulating film 214 is formed. Then, the same film 214 is patterned by etching as illustrated in FIG. 3C, thus forming the contact holes 214a. At the same time, the interlayer insulating film 214 is removed from the edge portions of the substrate 20

Next, the light-transmitting conductive film making up the second conductive film 4b is formed. Then, the same film is patterned by etching as illustrated in FIG. 3D, thus forming the relay electrodes 215 and shield electrode 28. At this time, the shield electrode 28 is formed in such a manner that it hangs over the outer periphery of the interlayer insulating film 214. As a result, the shield electrode 28 covers the side portion 214e of the interlayer insulating film 214. It should be noted that, in the present embodiment, a light-transmitting top coat layer 219 is formed on top of the second conductive film 4b. The top coat layer 219 is made, for example, of a resin composition or silicon oxide and formed by applying and hardening a liquid composition.

In the present embodiment, the first and second mounting terminals 24a and 24b are formed at the same time in the above step. That is, when the input position detection electrodes 21 and wires 27 are formed with the first conductive film 4a, the same film 4a is left in a region overlapping the first or second mounting terminal 24a or 24b as illustrated in FIGS. 5B and 5C. It should be noted, however, that, in this condition, the first conductive film 4a left in the region overlapping the first or second mounting terminal 24a or 24b will be removed by etching when the relay electrodes 215 and shield electrode 28 are formed with the second conductive film 4b. In the present embodiment, therefore, the second conductive film 4b is left in a region overlapping the first or second mounting terminal 24a or 24b when the relay electrodes 215 and shield electrode 28 are formed with the second conductive film 4b. This ensures that the first conductive film 4a formed in the region overlapping the first or second mounting terminal 24a or 24b is left unremoved by etching.

It should be noted that when the relay electrodes 215 and shield electrode 28 are formed with the second conductive film 4b, the second conductive film 4b left with the second mounting terminal 24b is connected to the shield electrode 28. In contrast, an interruption portion is provided between the same film 4b left with the first mounting terminal 24a and the shield electrode 28. It should be noted, however, that the edge portion of the second conductive film 4b left with the first mounting terminal 24a overlaps the interlayer insulating film 214. Therefore, the second conductive film 4b formed in the region overlapping the first mounting terminal 24a completely overlaps the first conductive film 4a formed in the region overlapping the first mounting terminal 24a. This positively ensures that the first conductive film 4a is left unremoved in the region overlapping the first mounting terminal 24a.

Further, when the wires 27 are formed in the present embodiment, the first conductive film 4a should preferably extend along the region where the wires 27 are formed, and a metal layer 4c made, for example, of chromium, silver, aluminum or silver-aluminum alloy should preferably be provided on top of the first conductive film 4a so as to extend along the region where the wires 27 are formed, as illustrated in FIGS. 6A to 6C. This multi-layer structure contributes to reduced resistance of the wires 27.

(Input Position Detection Operation)

In the electrostatic capacitance input device 1 according to the present embodiment, the IC 10 is connected to the first and second mounting terminals 24a and 24b of the input panel 2 via the flexible wiring board 35 as illustrated in FIG. 1B. Here, the IC 10 includes terminals 11a and a terminal 11b. The terminals 11a sequentially output a position detection signal VD to the first mounting terminals 24a via the flexible wiring board 35. The terminal 11b outputs a shield potential VS to the second mounting terminal 24b via the flexible wiring board 35. It should be noted that the IC 10 also includes a ground terminal adapted to output a ground potential to the input panel 2. However, this terminal is not directly related to the present application. Therefore, the description and illustration thereof are omitted.

In the electrostatic capacitance input device 1 configured as described above, the IC 10 outputs the position detection signal VD, for example, in the form of a rectangular pulse illustrated in FIG. 1C. As a result, when the input position detection electrode 21 has no parasitic capacitance, a signal having a waveform shown by a solid line in FIG. 1C is output from the terminals 11a. In contrast, if the input position detection electrode 21 has a parasitic capacitance, the waveform is distorted due to the capacitance as illustrated by a dashed line in FIG. 1C. This makes it possible to determine whether the input position detection electrodes 21 have any parasitic capacitance. In the present embodiment, therefore, the position detection signal VD is sequentially output to each of the plurality of input position detection electrodes 21 to monitor the electrostatic capacitance coupled thereto. As a result, when a finger approaches one of the plurality of input position detection electrodes 21, the electrostatic capacitance of the same electrode 21 approached by the finger increases by the amount formed between the electrode and finger, thus allowing for the electrode in question to be identified.

(Function and Effect of the Present Embodiment)

The electrostatic capacitance input device 1 according to the present embodiment is susceptible to electromagnetic noise because it detects the changes in capacitance coupled to the input position detection electrodes 21. In the present embodiment, therefore, a shield layer 35b is formed for the wires 35a that are formed on the flexible wiring board 35. The shield potential VS is applied to the shield layer 35b via a shielding wire 35c. In the present embodiment, the potential applied to the shield layer 35b as the shield potential VS has the same waveform (and phase) as the position detection signal VD supplied to the input position detection electrodes 21. This ensures freedom from parasitic capacitance between the wires 35a and shield layer 35b.

Further, in the present embodiment, the shield potential VS having the same waveform (and phase) as the position detection signal VD is applied to the shield electrode 28 from the IC 10 via a shielding wire 35d of the flexible wiring board 35 and the second mounting terminals 24b. Here, the shield electrode 28 overlaps, on the input operation side, the plurality of wires 27 extending in the outer region 2b of the input region 2a of the substrate 20. The shield electrode 28 shuts out electromagnetic noise trying to find its way into the wires 27 from the input operation side, thus making the input panel 2 immune to electromagnetic waves trying to find their way from the input operation side. Therefore, the electrostatic capacitance input device 1 according to the present embodiment is unlikely to malfunction due to electromagnetic noise. Further, the shield electrode 28 is not provided in the input region 2a on the input operation side, thus posing no hindrance to input position detection based on electrostatic capacitance.

Further, the shield potential VS has the same waveform (and phase) as the position detection signal VD supplied to the input position detection electrodes 21. This ensures freedom from parasitic capacitance between the wires 27 and shield electrode 28. As a result, even if the shield electrode 28 is provided, input position detection based on electrostatic capacitance will not be hindered.

Further, of the first and second conductive films 4a and 4b used to form the first and second input position detection electrodes 211 and 212 and relay electrodes 215, the first conductive film 4a on the side opposite to the input operation side is used to form the wires 27. In contrast, of the first and second conductive films 4a and 4b, the second conductive film 4b on the input operation side is used to form the shield electrode 28. This provides advantages including no need to provide a shield electrode externally.

Further, the shield electrode 28 is provided all along the outer periphery of the substrate 20, thus shutting out electromagnetic noise trying to find its way from the input operation side more positively. Still further, the shield electrode 28 covers the side portion 214e of the interlayer insulating film 214 near the outer periphery of the substrate 20. This shuts out electromagnetic noise trying to find its way into the wires 27 from the surrounding environment.

Further, the first and second mounting terminals 24a and 24b are provided in the outer region 2b of the substrate 20 using both the first and second conductive films 4a and 4b. This allows for a potential to be applied externally to the shield electrode 28 via the flexible wiring board 35 connected to the substrate 20, thus making it possible to apply the shield potential VS to the shield electrode 28 with ease. Further, the common flexible wiring board 35 can be connected to the first and second mounting terminals 24a and 24b. Moreover, the second mounting terminals 24b are electrically connected to the shield electrode 28, one on each side of the region where the first mounting terminals 24a are arranged, thus shutting out electromagnetic noise trying to find its way into the wires 27 from the surrounding environment.

Embodiment 2

Figure 7A:
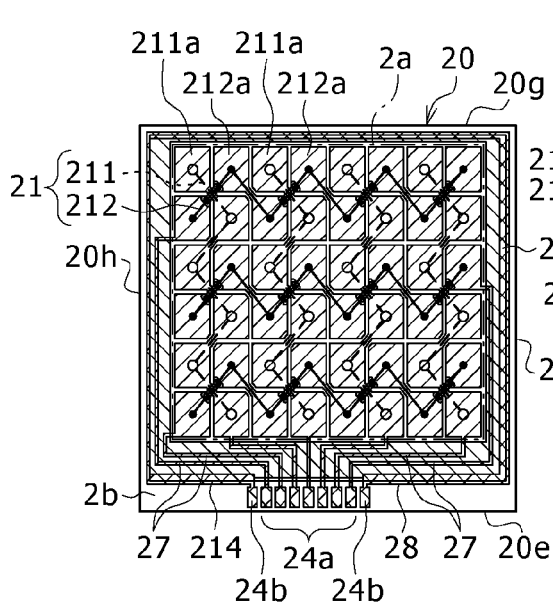
FIGS. 7A to 7D are explanatory diagrams schematically illustrating the two-dimensional configuration of an electrostatic capacitance input device according to embodiment 2.
Figure 7B:
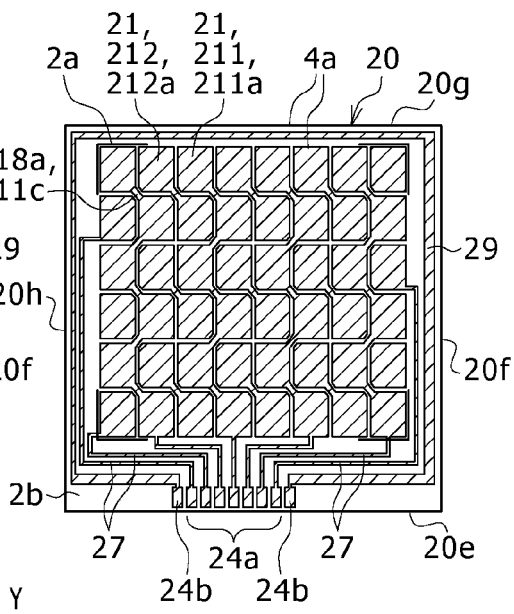
Figure 7C:
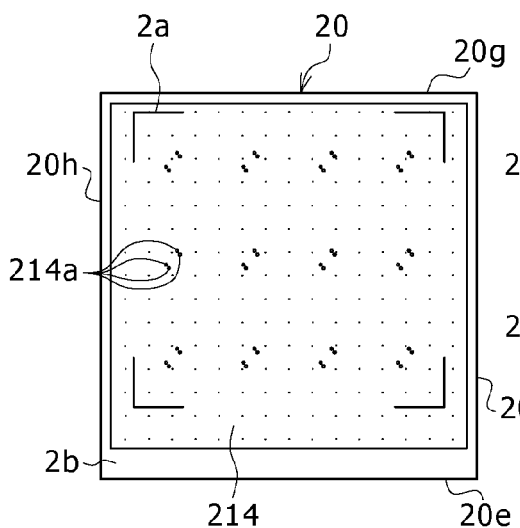
Figure 7D:
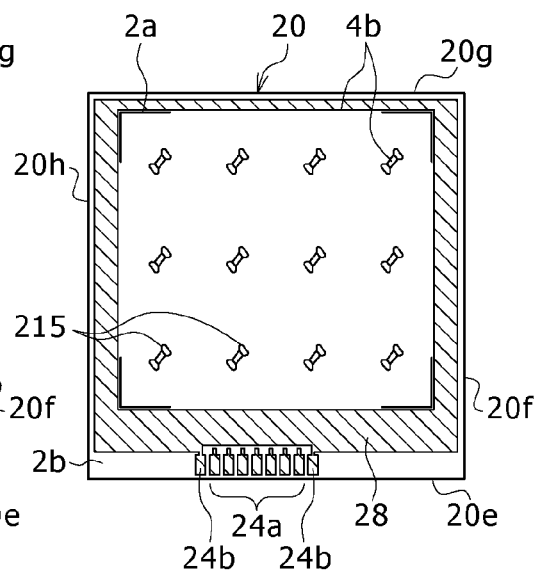

A description will be given of an example based on embodiment 1 in which a shielding auxiliary electrode 29 is added to the substrate 20 with reference to FIGS. 7A to 9C. FIGS. 7A to 7D are explanatory diagrams schematically illustrating the two-dimensional configuration of the electrostatic capacitance input device 1 according to embodiment 2 of the present application. FIG. 7A is an explanatory diagram illustrating the two-dimensional positional relationship between the electrodes and other components formed on the substrate 20 of the electrostatic capacitance input device 1. FIG. 7B is an explanatory diagram illustrating the two-dimensional configuration of the first conductive film 4a formed on the substrate 20. FIG. 7C is an explanatory diagram illustrating the two-dimensional configuration of the interlayer insulating film 214 formed on the substrate 20. FIG. 7D is an explanatory diagram illustrating the two-dimensional configuration of the second conductive film 4b formed on the substrate 20. FIG. 7A illustrates the elements shown in FIGS. 7B, 7C and 7D in an overlapping fashion.

Figure 8:
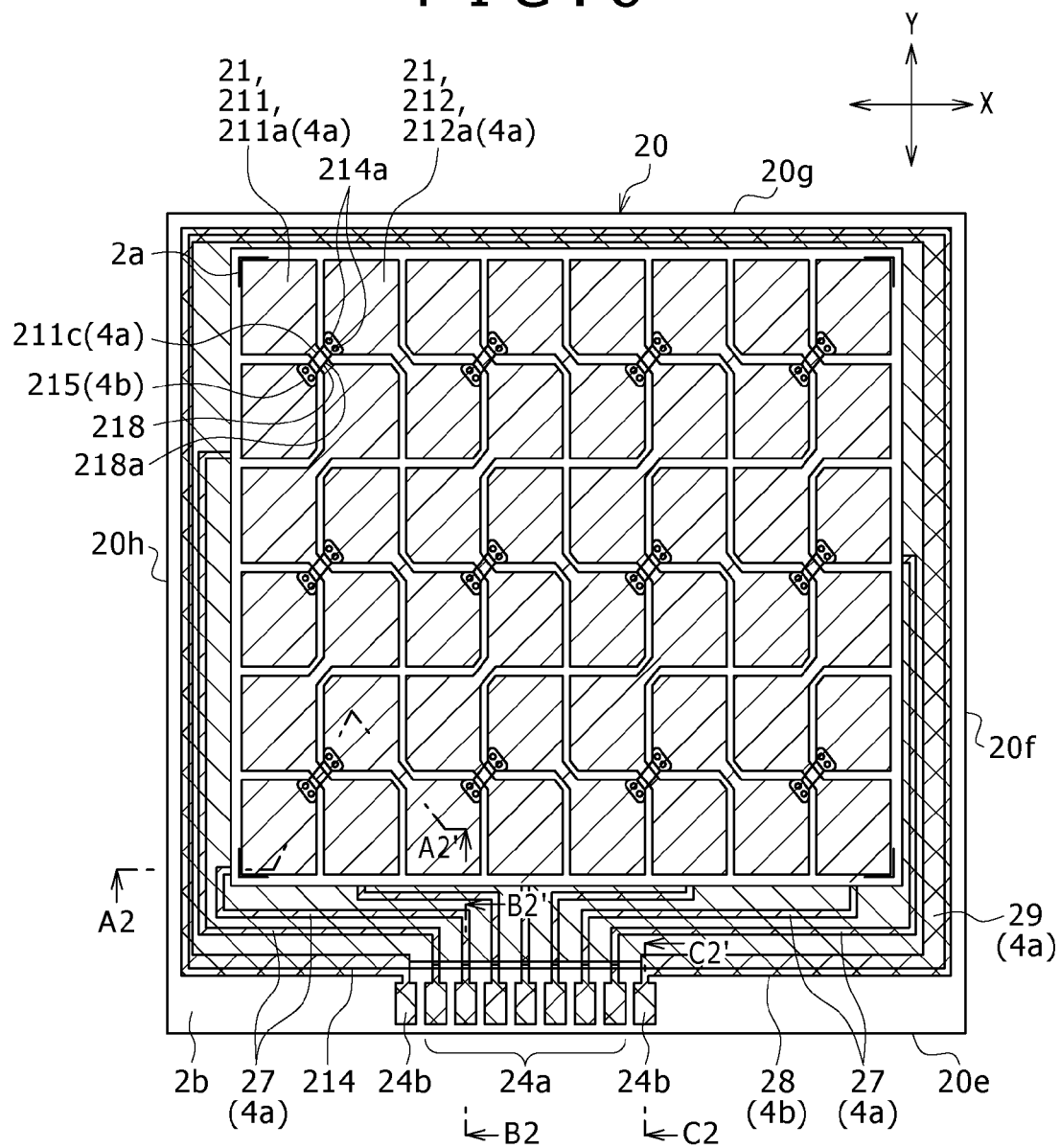
FIG. 8 is an explanatory diagram illustrating, in an enlarged fashion, the two-dimensional configuration of the electrodes and other components formed on the substrate of the electrostatic capacitance input device according to embodiment 2.
Figure 9A:
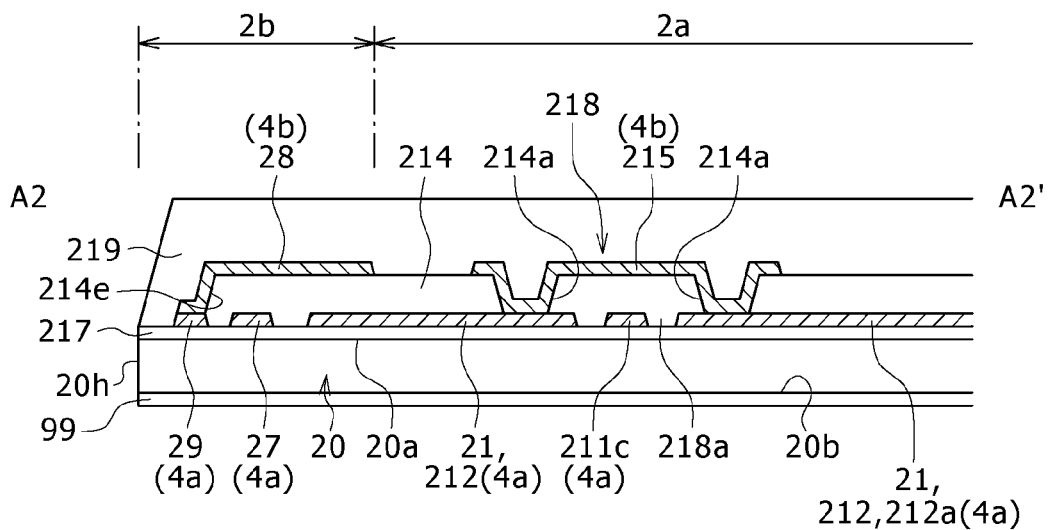
FIGS. 9A to 9C are explanatory diagrams schematically illustrating the cross-sectional configuration of the substrate of the electrostatic capacitance input device according to embodiment 2.
Figure 9B:
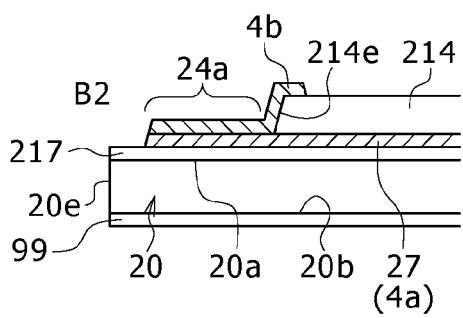
Figure 9C:
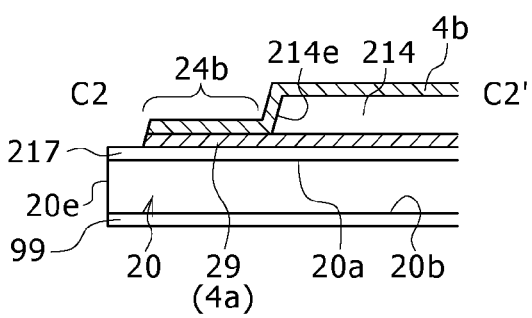

FIG. 8 is an explanatory diagram illustrating, in an enlarged fashion, the two-dimensional configuration of the electrodes and other components formed on the substrate 20 of the electrostatic capacitance input device 1 according to embodiment 2 of the present application. FIGS. 9A to 9C are explanatory diagrams illustrating the cross-sectional configuration of the substrate 20 of the electrostatic capacitance input device 1 according to embodiment 2 of the present application. FIGS. 9A, 9B and 9C are cross-sectional views of the substrate 20 taken along lines A2-A2', B2-B2' and C2-C2' respectively shown in FIG. 8. It should be noted that the present embodiment is identical in basic configuration to embodiment 1. Therefore, like components are denoted by the same reference numerals, and the description thereof is omitted.

In the electrostatic capacitance input device 1 according to the present embodiment, the first conductive film 4a, interlayer insulating film 214 and second conductive film 4b are also formed, from bottom to top as seen from the substrate 20, on the first surface 20a of the substrate 20 as in embodiment 1, as illustrated in FIGS. 7A to 9C.

As illustrated in FIG. 7B, the first conductive film 4a is formed as the pad portions 211a and 212a of the first and second input position detection electrodes 211 and 212 and the wires 27 as in embodiment 1. The first conductive film 4a is also formed in a region near the edge portion 20e overlapping the first and second mounting terminals 24a and 24b.

Unlike embodiment 1, the first conductive film 4a is formed as the shielding auxiliary electrode 29 outside the wires 27 in the outer region 2b of the substrate 20 in the present embodiment. Here, the wires 27 are formed in the regions corresponding to the three sides of the substrate 20, i.e., one region between the input region 2a and the edge portion 20e of the substrate 20, another between the input region 2a and the edge portion 20f of the substrate 20, and still another between the input region 2a and the edge portion 20h of the substrate 20. In contrast, the shielding auxiliary electrode 29 is formed along all the sides of the substrate 20, i.e., one region sandwiched between the input region 2a and the edge portion 20e of the substrate 20, another between the input region 2a and the edge portion 20f of the substrate 20, still another between the input region 2a and the edge portion 20g of the substrate 20, and still another between the input region 2a and the edge portion 20h of the substrate 20. It should be noted that the shielding auxiliary electrode 29 bends midway toward the second mounting terminal 29 in the region sandwiched between the input region 2a and the edge portion 20e of the substrate 20. The same electrode 29 is interrupted in the region where the wires 27 extend.

As illustrated in FIG. 7C, the interlayer insulating film 214 is formed over a large region excluding the outer periphery of the substrate 20 as in embodiment 1. The contact holes 214a are formed in the interlayer insulating film 214, with each set containing the four contact holes 214a. Here, the interlayer insulating film 214 is formed slightly more inward than the outer periphery of the substrate 20. As a result, the interlayer insulating film 214 is not formed near the outer periphery of the substrate 20.

As illustrated in FIG. 7D, the second conductive film 4b is formed as the relay electrodes 215 in the regions of the input region 2a overlapping the contact holes 214a shown in FIG. 7C. Further, the same film 4b is formed in the outer region 2b of the input region 2a as the shield electrode 28. Still further, the same film 4b is formed in a region near the edge portion 20e overlapping the first and second mounting terminals 24a and 24b. A potential having the same waveform (and phase) as the position detection signal supplied to the input position detection electrodes 21 is applied to the shield electrode 28.

Further, the two second mounting terminals 24b are formed in the outer region 2b on the first surface 20a of the substrate 20, one on each side of the region where the first mounting terminals 24a are arranged. The first mounting terminals 24a are electrically connected to the wires 27, and the second mounting terminals 24b to the shield electrode 28 on both sides of the region where the first mounting terminals 24a are arranged. The present embodiment is similar in other configurations to embodiment 1. Therefore, the description thereof is omitted.

In the input panel 2 configured as described above, of the first and second conductive films 4a and 4b, the first conductive film 4a on the side opposite to the input operation side is used to form the wires 27 as in embodiment 1. Of the first and second conductive films 4a and 4b, the second conductive film 4b on the input operation side is used to form the shield electrode 28. The same electrode 28 overlaps the wires 27 on the input operation side. This provides the same advantages as in embodiment 1 including shutting out electromagnetic noise trying to find its way into the wires 27 from the input operation side thanks to the shield electrode 28.

The shielding auxiliary electrode 29 is formed to the outside of the outer periphery of the interlayer insulating film 214 at the positions corresponding to the four sides of the substrate 20. Part of the same electrode 29 is exposed from the interlayer insulating film 214. On the other hand, the shield electrode 28 is formed to the outside of the outer periphery of the interlayer insulating film 214 at the positions corresponding to the four sides of the substrate 20. Therefore, the shield electrode 28 covers the side portion 214e on the outer periphery side of the interlayer insulating film 214. The same electrode 28 is connected to the shielding auxiliary electrode 29 exposed from the interlayer insulating film 214 all along the longitudinal direction (extension direction) of the same electrode 29 on the outer periphery side of the interlayer insulating film 214 (in the region free from the interlayer insulating film 214). This provides substantially reduced resistance of the shield electrode 28. Further, the shield electrode 28 and shielding auxiliary electrode 29 suppress electromagnetic noise from finding its way into the wires 27 from the surrounding environment.

Embodiment 3

A description will be given of an example in which the input position detection electrodes are formed with the second conductive film 4b in the type of the electrostatic capacitance input device 1 described with reference to FIG. 2A. FIGS. 10A to 10D are explanatory diagrams schematically illustrating the two-dimensional configuration of the electrostatic capacitance input device 1 according to embodiment 3 of the present application. FIG. 10A is an explanatory diagram illustrating the two-dimensional positional relationship between the electrodes and other components formed on the substrate 20 of the electrostatic capacitance input device 1. FIG. 10B is an explanatory diagram illustrating the two-dimensional configuration of the first conductive film 4a formed on the substrate 20. FIG. 10C is an explanatory diagram illustrating the two-dimensional configuration of the interlayer insulating film 214 formed on the substrate 20. FIG. 10D is an explanatory diagram illustrating the two-dimensional configuration of the second conductive film 4b formed on the substrate 20. FIG. 10A illustrates the elements shown in FIGS. 10B, 10C and 10D in an overlapping fashion.

Figure 11:
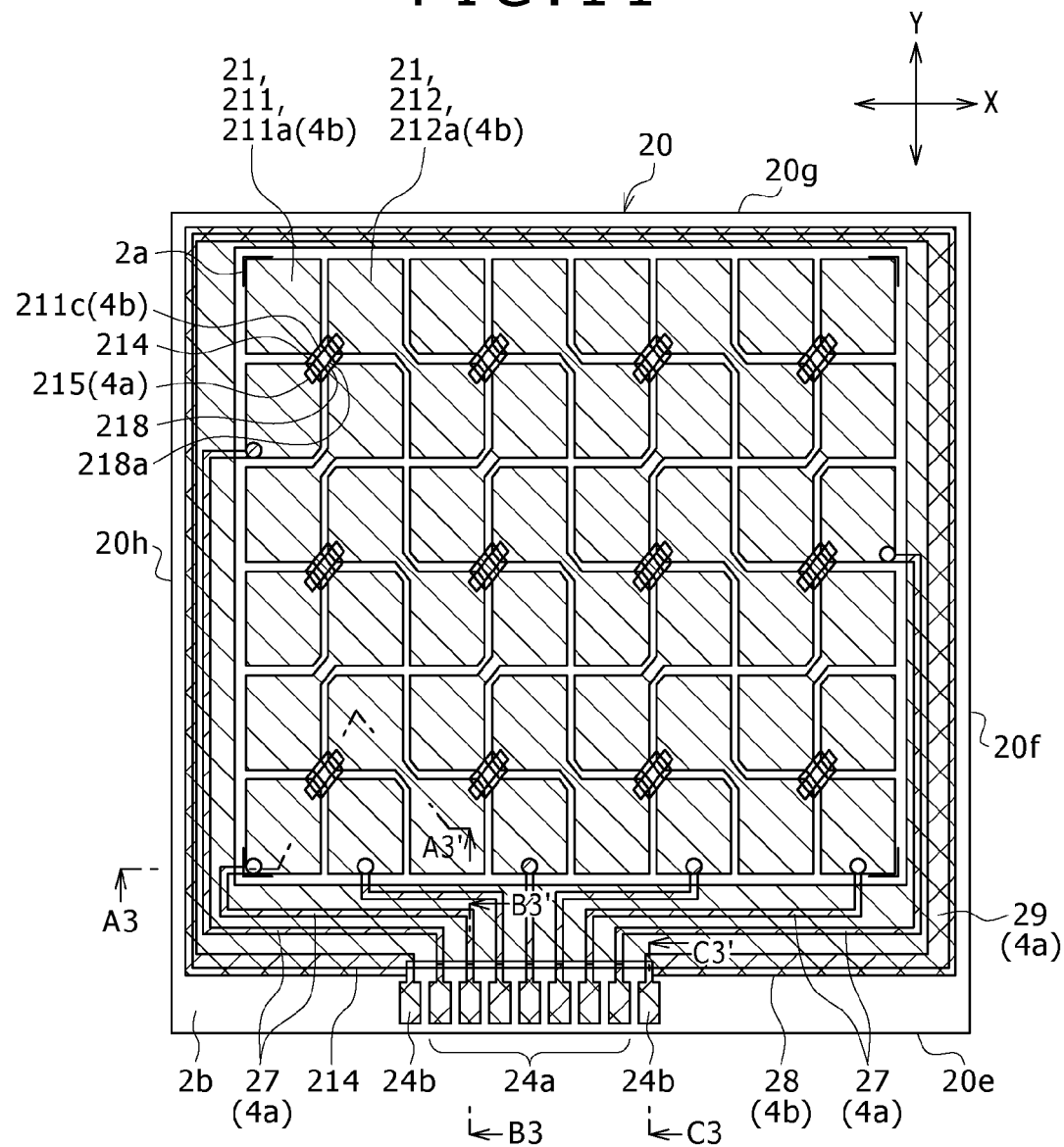
FIG. 11 is an explanatory diagram illustrating, in an enlarged fashion, the two-dimensional configuration of the electrodes and other components formed on the substrate of the electrostatic capacitance input device according to embodiment 3.
Figure 12A:
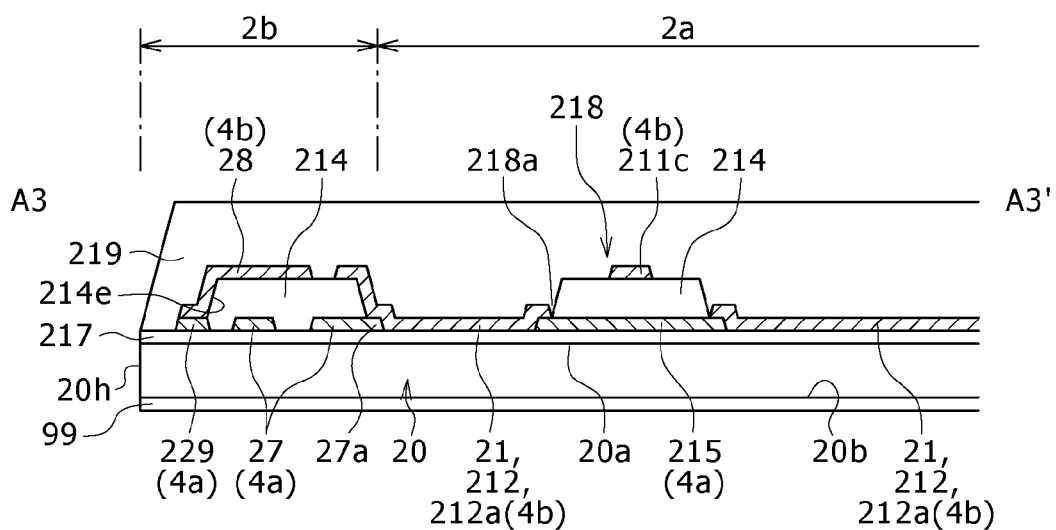
FIGS. 12A to 12C are explanatory diagrams schematically illustrating the cross-sectional configuration of the substrate of the electrostatic capacitance input device according to embodiment 3.
Figure 12B:
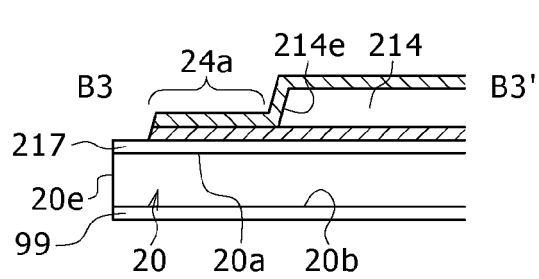
Figure 12C:
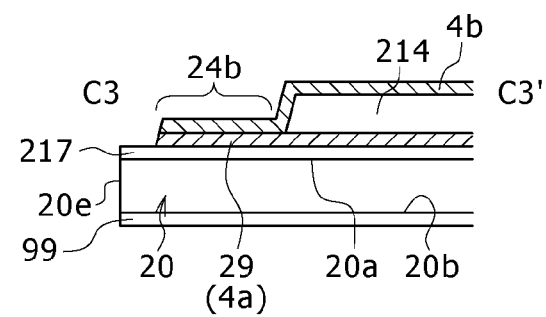

FIG. 11 is an explanatory diagram illustrating, in an enlarged fashion, the two-dimensional configuration of the electrodes and other components formed on the substrate 20 of the electrostatic capacitance input device 1 according to embodiment 3 of the present application. FIGS. 12A to 12C are explanatory diagrams illustrating the cross-sectional configuration of the substrate 20 of the electrostatic capacitance input device 1 according to embodiment 3 of the present application. FIGS. 12A, 12B and 12C are cross-sectional views of the substrate 20 taken along lines A3-A3', B3-B3' and C3-C3' respectively shown in FIG. 11. It should be noted that the present embodiment is identical in basic configuration to embodiment 1. Therefore, like components are denoted by the same reference numerals, and the description thereof is omitted.

In the electrostatic capacitance input device 1 according to the present embodiment, the first conductive film 4a, interlayer insulating film 214 and second conductive film 4b are also formed in this order, from bottom to top as seen from the substrate 20, on the first surface 20a of the substrate 20 as in embodiment 1, as illustrated in FIGS. 10A to 12C.

As illustrated in FIG. 10B, the first conductive film 4a is formed as the plurality of relay electrodes 215 in the input region 2a first. Further, the same film 4a is formed as the plurality of wires 27 in the outer region 2b. Here, the wires 27 have their edge portions located inside the input region 2a. These edge portions serve as connection portions 27a that are wider than the wires 27. Further, the first conductive film 4a is formed as the shielding auxiliary electrode 29 in the regions of the outer region 2b corresponding to the four sides of the substrate 20 as in embodiment 2.

As illustrated in FIG. 10C, the interlayer insulating film 214 is formed only at the intersecting portions 218, which will be described later, in the input region 2a. The same film 214 is formed in the form of a rectangular frame in the outer region 2b so as to surround the input region 2a. Here, the interlayer insulating film 214 is formed slightly more inward than the outer periphery of the substrate 20. As a result, the interlayer insulating film 214 is not formed near the outer periphery of the substrate 20.

As illustrated in FIG. 10D, the second conductive film 4b is formed as a plurality of rectangular regions in the input region 2a. These rectangular regions make up the pad portions 211a and 212a (large area portions) of the first and second input position detection electrodes 211 and 212. Further, the same film 4b is formed as the shield electrode 28 in the form of a rectangular frame in the outer region 2b. Still further, the same film 4b is formed in a region near the edge portion 20e overlapping the first and second mounting terminals 24a and 24b.

When the first conductive film 4a, interlayer insulating film 214 and second conductive film 4b, that are configured as described above, are stacked one on top of another, the substrate 20 is configured as illustrated in FIGS. 10A, 11 and 12A to 12C. When seen in plan view, the substrate 20 has the plurality of input position detection electrodes 21 formed in the input region 2a. In the present embodiment, the input position detection electrodes 21 include the plurality of columns of first and second input position detection electrodes 211 and 212. The first input position detection electrodes 211

(shown by thick solid lines in FIG. 10A) extend in the first direction (direction shown by arrow Y). The second input position detection electrodes 212 (shown by thick dashed lines in FIG. 10A) extend in the second direction (direction shown by arrow X). Here, of the first and second conductive films 4a and 4b, the first conductive film 4a is used to form the input position detection electrodes 21 (first and second input position detection electrodes 211 and 212). As a result, the input position detection electrodes 21 are made up of the same layer. On the first surface 20a of the substrate 20, therefore, the plurality of intersecting portions 218 exist between the first and second input position detection electrodes 211 and 212. In the present embodiment, of the first and second input position detection electrodes 211 and 212, the first input position detection electrodes 211 are connected in the Y direction by the junction portions 211c made of the second conductive film 4b at the intersecting portions 218, thus extending in the Y direction. In contrast, the interruption portions 218a are formed at the intersecting portions 218 for the second input position detection electrodes 212. Further, the relay electrodes 215 and interlayer insulating film 214 are formed with the first conductive film 4a at the intersecting portions 218. It should be noted that the second input position detection electrodes 212 are electrically connected together in the X direction by the relay electrodes 215.

On the other hand, although the wires 27 are formed with the first conductive film 4a, the connection portions 27a are located inside the input region 2a. Moreover, the overlying layer of the connection portions 27a is not covered with the interlayer insulating film 214. Therefore, when formed with the second conductive film 4b, the input position detection electrodes 21 overlap the connection portions 27a of the wires 27. As a result, the same electrodes 21 are electrically connected to the connection portions 27a.

Further, the two second mounting terminals 24b are formed in the outer region 2b on the first surface 20a of the substrate 20, one on each side of the region where the first mounting terminals 24a are arranged. The first mounting terminals 24a are electrically connected to the wires 27, and the second mounting terminals 24b to the shield electrode 28 on both sides of the region where the first mounting terminals 24a are arranged. The present embodiment is similar in other configurations to embodiment 1. Therefore, the description thereof is omitted.

In the input panel 2 configured as described above, of the first and second conductive films 4a and 4b, the first conductive film 4a on the side opposite to the input operation side is used to form the wires 27 as in embodiments 1 and 2. Of the first and second conductive films 4a and 4b, the second conductive film 4b on the input operation side is used to form the shield electrode 28. The same electrode 28 overlaps the wires 27 on the input operation side. This provides the same advantages as in embodiment 1 including shutting out electromagnetic noise trying to find its way into the wires 27 from the input operation side thanks to the shield electrode 28.

Further, the shield electrode 28 covers the side portion 214e on the outer periphery side of the interlayer insulating film 214 as in embodiment 2. The same electrode 28 is connected to the shielding auxiliary electrode 29 exposed from the interlayer insulating film 214 all along the longitudinal direction (extension direction) of the same electrode 29 on the outer periphery side of the interlayer insulating film 214 (in the region free from the interlayer insulating film 214). This provides substantially reduced resistance of the shield electrode 28. Further, the shield electrode 28 and shielding auxiliary electrode 29 suppress electromagnetic noise from finding its way into the wires 27 from the surrounding environment.

Still further, in the present embodiment, the interlayer insulating film 214 is formed only at the intersecting portions 218 in the input region 2a. Therefore, the same film 214 is hardly formed in positions overlapping the pad portions 211a and 212a of the input position detection electrodes 21 (first and second input position detection electrodes 211 and 212). Therefore, the input panel 2 offers high light transmittance, thus allowing for the electro-optical device 100 equipped with an input device according to the present embodiment to display a bright image.

Embodiment 4

Figure 13A:
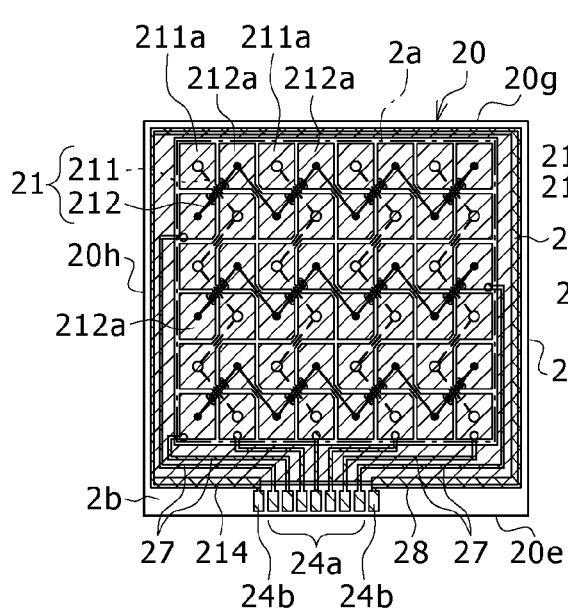
FIGS. 13A to 13D are explanatory diagrams schematically illustrating the two-dimensional configuration of the electrostatic capacitance input device according to embodiment 4.
Figure 13B:
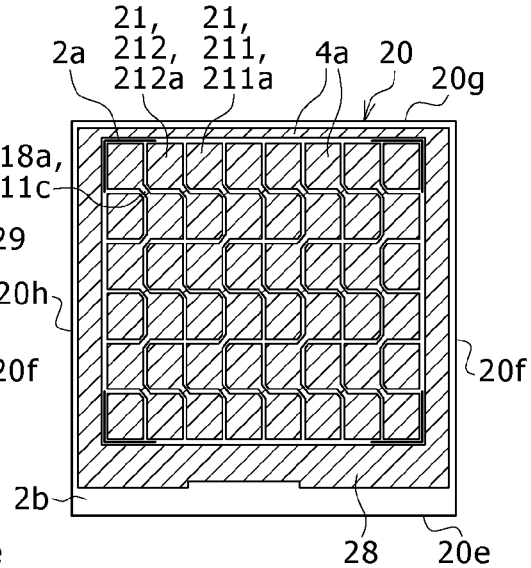
Figure 13C:
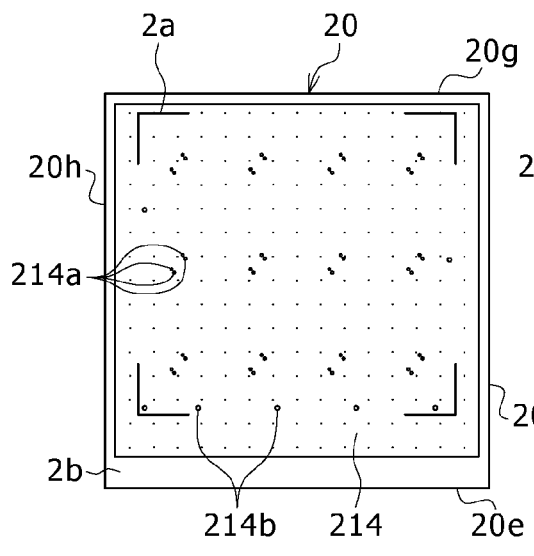
Figure 13D:
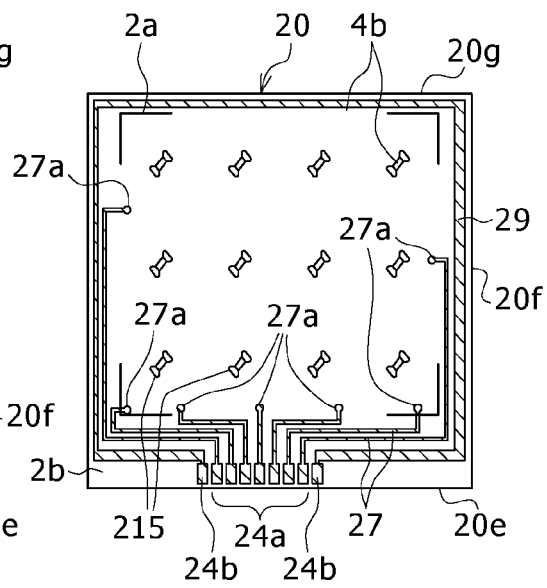

A description will be given below of a configuration example of the type of the electrostatic capacitance input device 1, described with reference to FIG. 2B, with reference to FIGS. 13A to 15C. FIGS. 13A to 13D are explanatory diagrams schematically illustrating the two-dimensional configuration of the electrostatic capacitance input device 1 according to embodiment 4 of the present application. FIG. 13A is an explanatory diagram illustrating the two-dimensional positional relationship between the electrodes and other components formed on the substrate 20 of the electrostatic capacitance input device 1. FIG. 13B is an explanatory diagram illustrating the two-dimensional configuration of the first conductive film 4a formed on the substrate 20. FIG. 13C is an explanatory diagram illustrating the two-dimensional configuration of the interlayer insulating film 214 formed on the substrate 20. FIG. 13D is an explanatory diagram illustrating the two-dimensional configuration of the second conductive film 4b formed on the substrate 20. FIG. 13A illustrates the elements shown in FIGS. 13B, 13C and 13D in an overlapping fashion.

Figure 14:
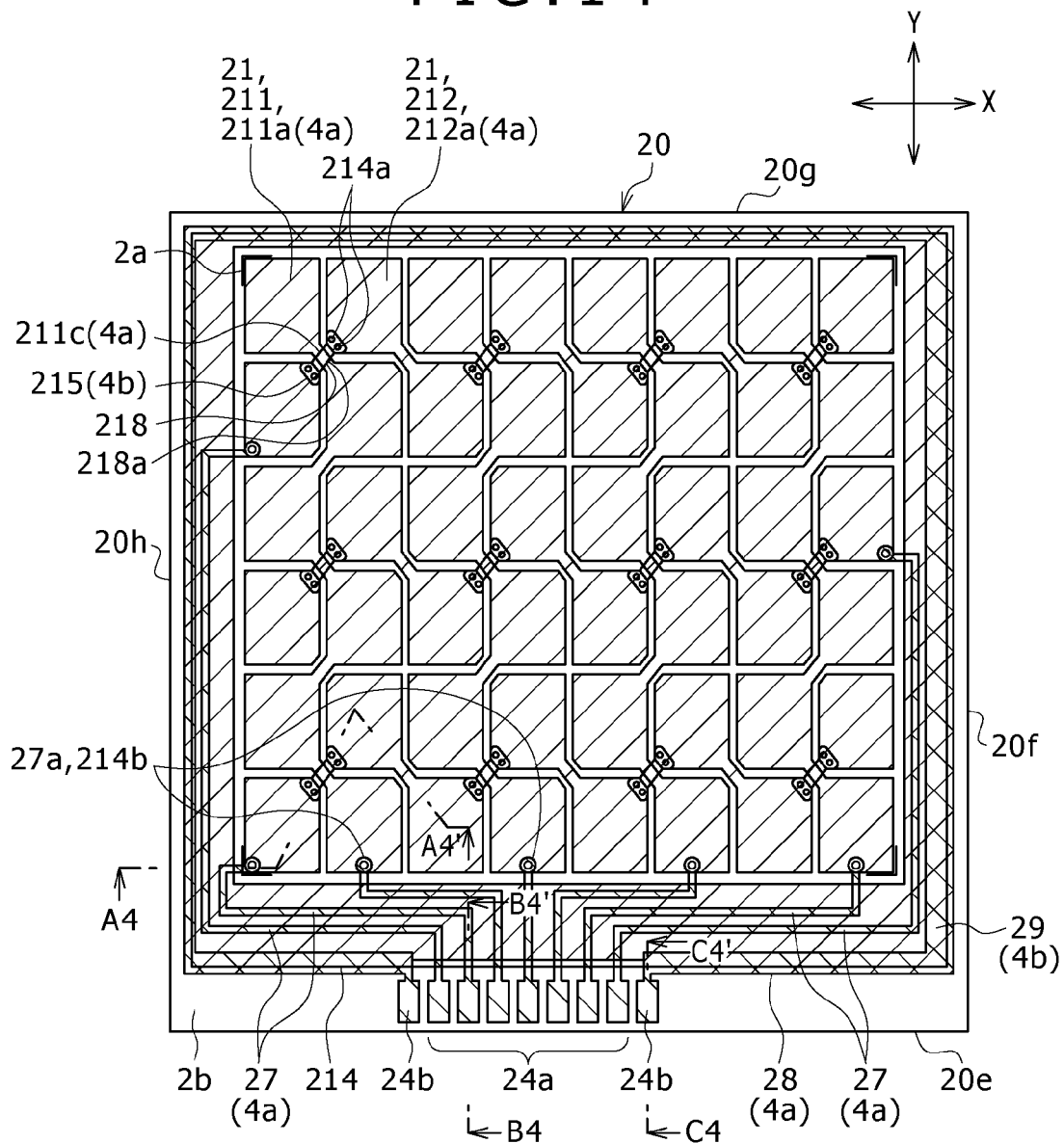
FIG. 14 is an explanatory diagram illustrating, in an enlarged fashion, the two-dimensional configuration of the electrodes and other components formed on the substrate of the electrostatic capacitance input device according to embodiment 4.
Figure 15A:
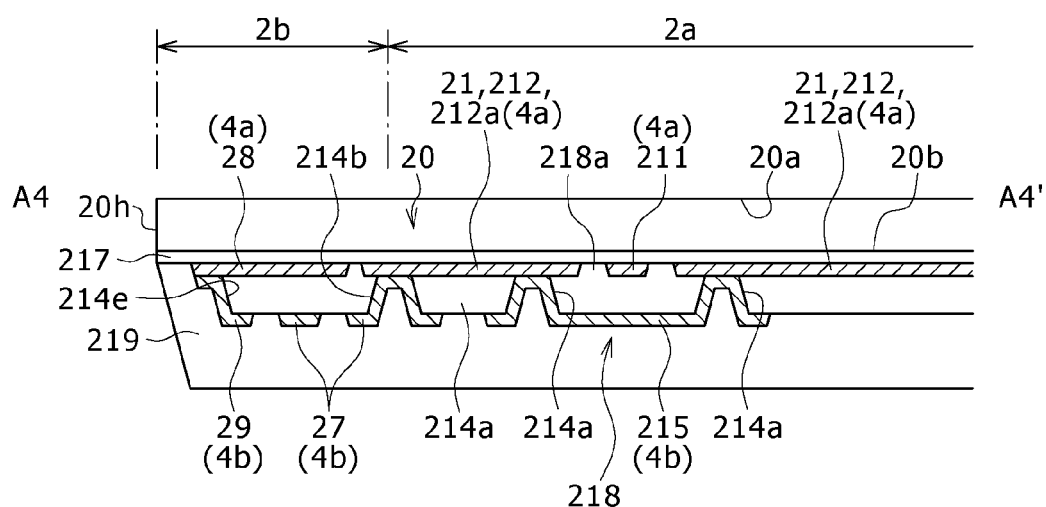
FIGS. 15A to 15C are explanatory diagrams illustrating the cross-sectional configuration of the electrostatic capacitance input device according to embodiment 4.
Figure 15B:
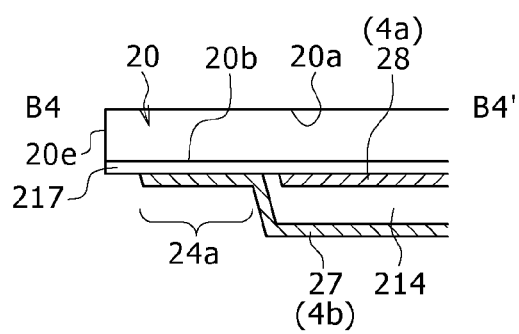
Figure 15C:
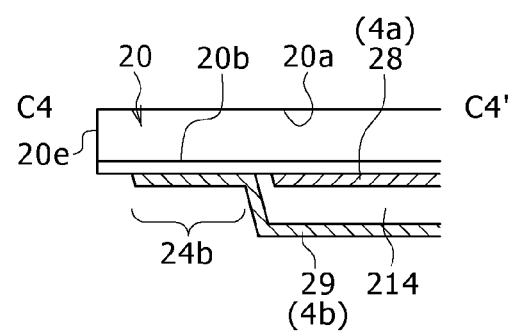

FIG. 14 is an explanatory diagram illustrating, in an enlarged fashion, the two-dimensional configuration of the electrodes and other components formed on the substrate 20 of the electrostatic capacitance input device 1 according to embodiment 4 of the present application. FIGS. 15A to 15C are explanatory diagrams illustrating the cross-sectional configuration of the substrate 20 of the electrostatic capacitance input device 1 according to embodiment 4 of the present application. FIGS. 15A, 15B and 15C are cross-sectional views of the substrate 20 taken along lines A4-A4', B4-B4' and C4-C4' respectively shown in FIG. 14. It should be noted that the present embodiment is identical in basic configuration to embodiment 1. Therefore, like components are denoted by the same reference numerals, and the description thereof is omitted.

In the electrostatic capacitance input device 1 according to the present embodiment, the first conductive film 4a, interlayer insulating film 214 and second conductive film 4b are formed in this order, from bottom to top as seen from the substrate 20, on the second surface 20b of the substrate 20, as illustrated in FIGS. 13A to 15C.

As illustrated in FIG. 13B, the first conductive film 4a is formed as a plurality of rectangular regions in the input region 2a first. These rectangular regions make up the pad portions 211a and 212a (large area portions) of the first and second input position detection electrodes 211 and 212. Further, the first conductive film 4a is formed as the shield electrode 28 in the outer region 2b. A potential having the same waveform (and phase) as the position detection signal VD supplied to the input position detection electrodes 21 is applied to the shield electrode 28.

As illustrated in FIG. 13C, the interlayer insulating film 214 is formed over a large region excluding the outer periphery of the substrate 20 as in embodiment 1. The contact holes 214a are formed in the interlayer insulating film 214, with each set containing the four contact holes 214a. Further, contact holes 214b are formed at the positions of the interlayer insulating film 214 overlapping the connection portions 27a of the wires 27 illustrated in FIG. 13D.

As illustrated in FIG. 13D, the second conductive film 4b is formed as the relay electrodes 215 overlapping the contact holes 214a shown in FIG. 13C in the input region 2a as in embodiment 1. Further, the same film 4b is formed in a region near the edge portion 20e overlapping first and second mounting terminals 24a and 24b. Still further, the same film 4b is formed as the plurality of wires 27 in the outer region 2b. The wires 27 have their edge portions located inside the input region 2a. These edge portions serve as the connection portions 27a that are wider than the wires 27. Moreover, the second conductive film 4b is formed as the shielding auxiliary electrode 29 in the regions of the outer region 2b corresponding to the four sides of the substrate 20. Here, the first mounting terminals 24a are connected to the wires 27, and the second mounting terminals 24b to the shielding auxiliary electrode 29.

When the first conductive film 4a, interlayer insulating film 214 and second conductive film 4b, that are configured as described above, are stacked one on top of another, the substrate 20 is configured as illustrated in FIGS. 13A, 14 and 15A to 15C. As a result, the plurality of input position detection electrodes 21 are formed in the input region 2a. On the other hand, the input position detection electrodes 21 (first and second input position detection electrodes 211 and 212) are formed with the first conductive film 4a, and the wires 27 with the second conductive film 4b. Even in this case, the contact holes 214b are formed in the interlayer insulating film 214. Therefore, the input position detection electrodes 21 and wires 27 are electrically connected via the contact holes 214b.

Further, the two second mounting terminals 24b are formed in the outer region 2b on the first surface 20a of the substrate 20, one on each side of the region where the first mounting terminals 24a are arranged. The first mounting terminals 24a are electrically connected to the wires 27, and the second mounting terminals 24b to the shield electrode 28 on both sides of the region where the first mounting terminals 24a are arranged. The present embodiment is similar in other configurations to embodiment 1. Therefore, the description thereof is omitted.

In the input panel 2 configured as described above, of the first and second conductive films 4a and 4b, the second conductive film 4b on the side opposite to the input operation side is used to form the wires 27. Of the first and second conductive films 4a and 4b, the first conductive film 4a on the input operation side is used to form the shield electrode 28. The same electrode 28 overlaps the wires 27 on the input operation side. This provides the same advantages as in embodiment 1 including shutting out electromagnetic noise trying to find its way into the wires 27 from the input operation side thanks to the shield electrode 28.

On the other hand, the shielding auxiliary electrode 29 is formed to the outside of the outer periphery of the interlayer insulating film 214 at the positions corresponding to the four sides of the substrate 20 as in embodiment 2. Part of the same electrode 29 is exposed from the interlayer insulating film 214. On the other hand, the shield electrode 28 is formed to the outside of the outer periphery of the interlayer insulating film 214 at the positions corresponding to the four sides of the substrate 20. Therefore, the shielding auxiliary electrode 29 covers the side portion 214e on the outer periphery side of the interlayer insulating film 214. The shield electrode 28 is connected to the shielding auxiliary electrode 29 exposed from the interlayer insulating film 214 all along the longitudinal direction of the same electrode 29 on the outer periphery side of the interlayer insulating film 214 (in the region free from the interlayer insulating film 214). This provides substantially reduced resistance of the shield electrode 28. Further, the shield electrode 28 and shielding auxiliary electrode 29 suppress electromagnetic noise from finding its way into the wires 27 from the surrounding environment.

Embodiment 5

Figure 16A:
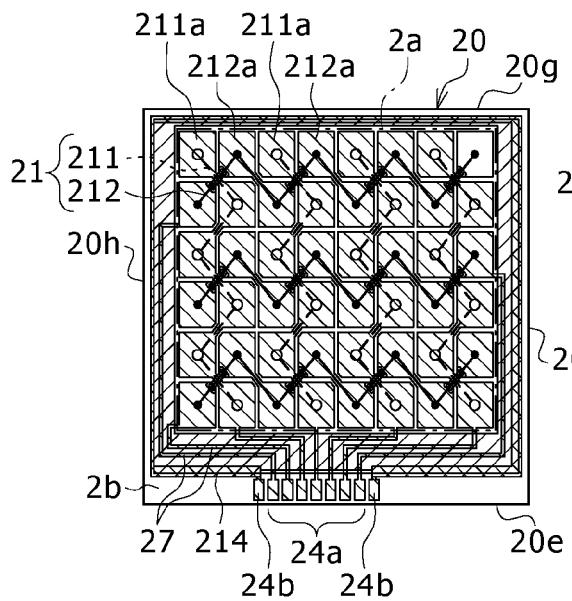
FIGS. 16A to 16D are explanatory diagrams schematically illustrating the two-dimensional configuration of the electrostatic capacitance input device according to embodiment 5.
Figure 16B:
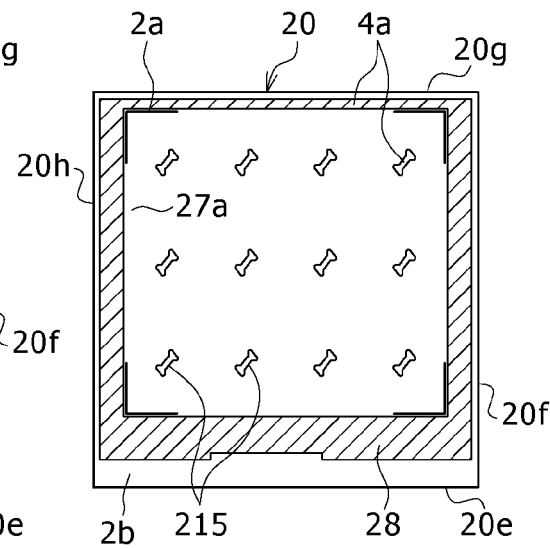
Figure 16C:
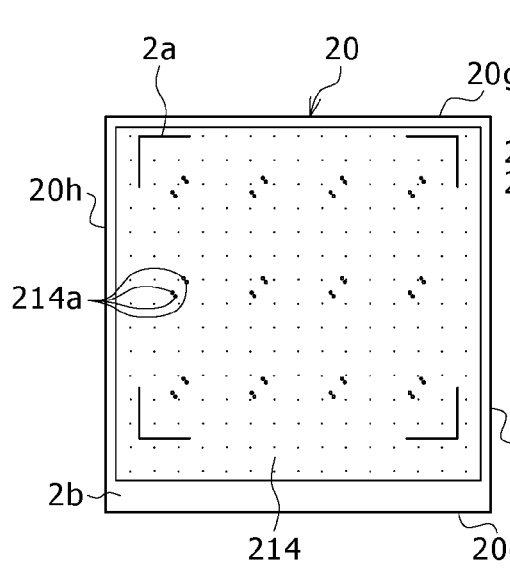
Figure 16D:
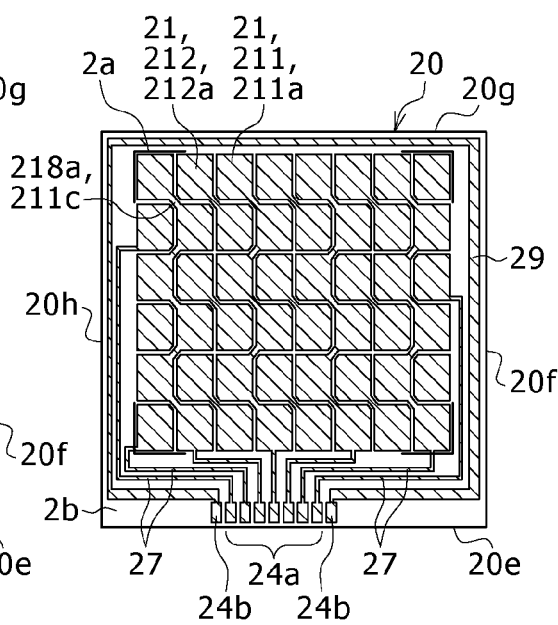

A description will be given of a configuration example based on embodiment 4 in which the input position detection electrodes 21 are formed with the second conductive film 4b with reference to FIGS. 16A to 18C. FIGS. 16A to 16D are explanatory diagrams schematically illustrating the two-dimensional configuration of the electrostatic capacitance input device 1 according to embodiment 5 of the present application. FIG. 16A is an explanatory diagram illustrating the two-dimensional positional relationship between the electrodes and other components formed on the substrate 20 of the electrostatic capacitance input device 1. FIG. 16B is an explanatory diagram illustrating the two-dimensional configuration of the first conductive film 4a formed on the substrate 20. FIG. 16C is an explanatory diagram illustrating the two-dimensional configuration of the interlayer insulating film 214 formed on the substrate 20. FIG. 16D is an explanatory diagram illustrating the two-dimensional configuration of the second conductive film 4b formed on the substrate 20. FIG. 16A illustrates the elements shown in FIGS. 16B, 16C and 16D in an overlapping fashion.

Figure 17:
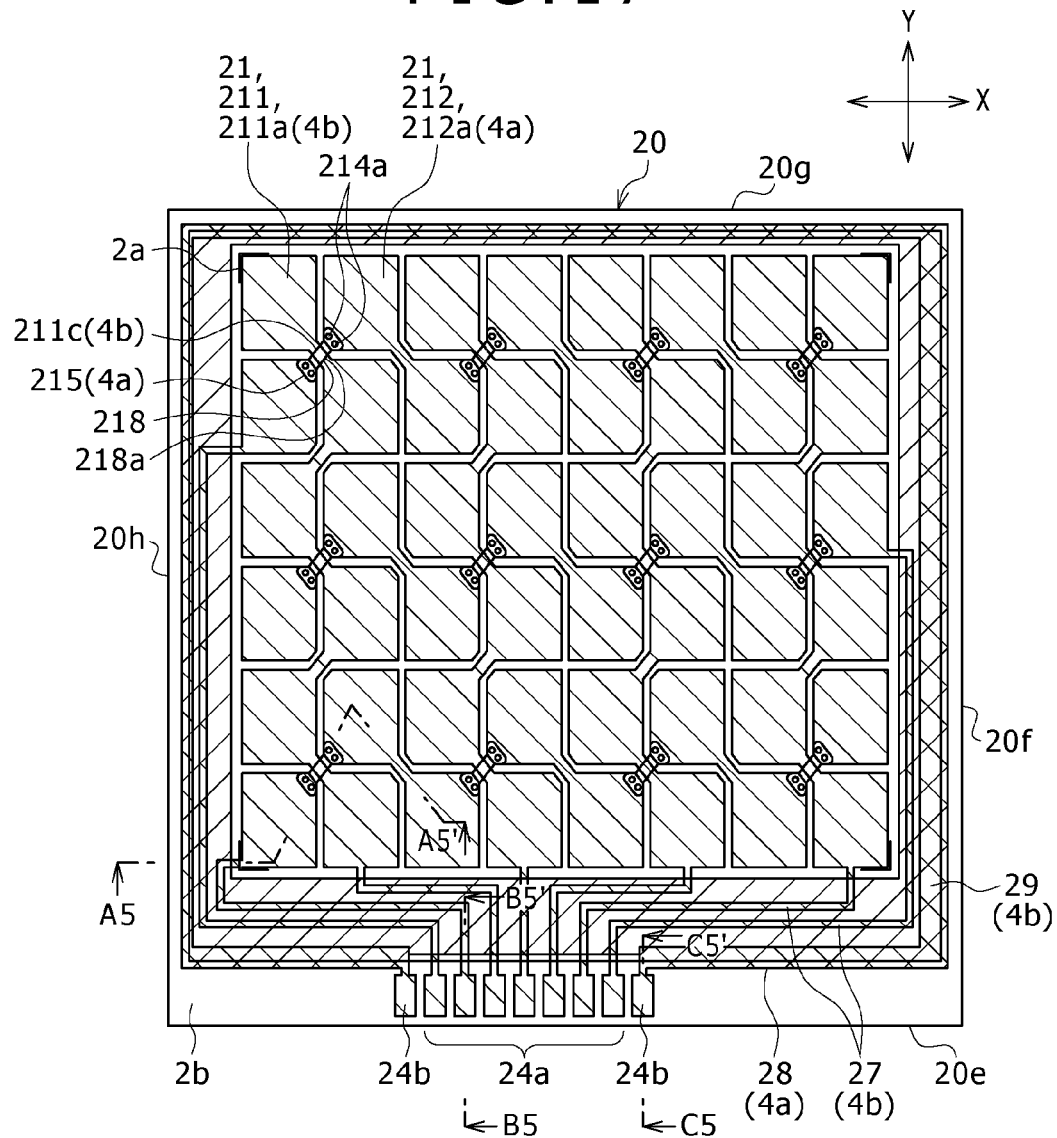
FIG. 17 is an explanatory diagram illustrating, in an enlarged fashion, the two-dimensional configuration of the electrodes and other components formed on the substrate of the electrostatic capacitance input device according to embodiment 5.
Figure 18A:
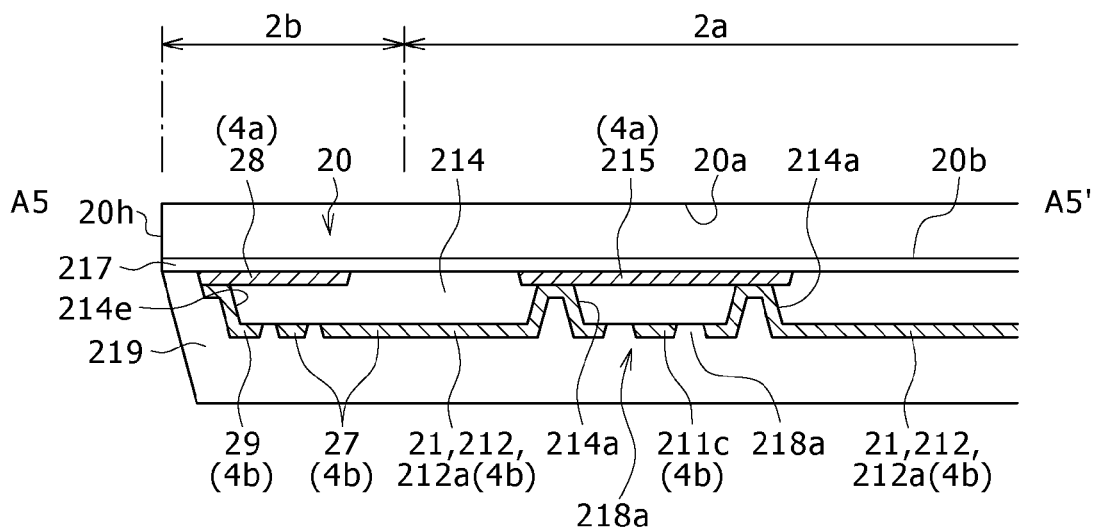
FIGS. 18A to 18C are explanatory diagrams schematically illustrating the cross-sectional configuration of the substrate of the electrostatic capacitance input device according to embodiment 5.
Figure 18B:
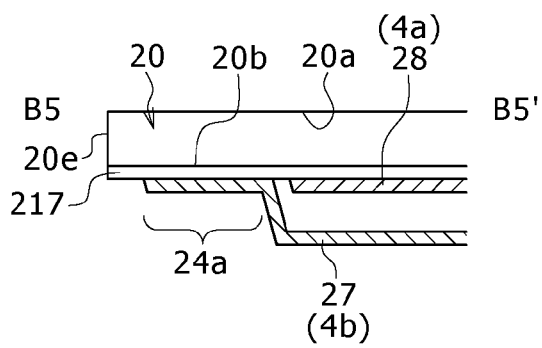
Figure 18C:
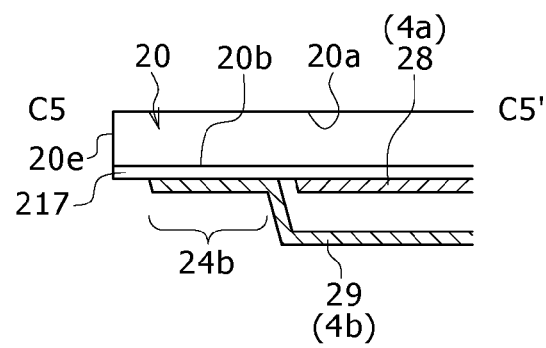

FIG. 17 is an explanatory diagram illustrating, in an enlarged fashion, the two-dimensional configuration of the electrodes and other components formed on the substrate 20 of the electrostatic capacitance input device 1 according to embodiment 5 of the present application. FIGS. 18A to 18C are explanatory diagrams illustrating the cross-sectional configuration of the substrate 20 of the electrostatic capacitance input device 1 according to embodiment 5 of the present application. FIGS. 18A, 18B and 18C are cross-sectional views of the substrate 20 taken along lines A5-A5', B5-B5' and C5-C5' respectively shown in FIG. 17. It should be noted that the present embodiment is identical in basic configuration to embodiment 1. Therefore, like components are denoted by the same reference numerals, and the description thereof is omitted.

In the electrostatic capacitance input device 1 according to the present embodiment, the first conductive film 4a, interlayer insulating film 214 and second conductive film 4b are formed in this order, from bottom to top as seen from the substrate 20, on the second surface 20b of the substrate 20, as illustrated in FIGS. 16A to 18C.

As illustrated in FIG. 16B, the first conductive film 4a is formed as the relay electrodes 215 at the positions of the input region 2a overlapping the contact holes 214a which will be described later. Further, the first conductive film 4a is also formed as the shield electrode 28 in the outer region 2b.

As illustrated in FIG. 16C, the interlayer insulating film 214 is formed over a large region excluding the outer periphery of the substrate 20 as in embodiment 1. The contact holes 214a are formed in the interlayer insulating film 214, with each set containing the four contact holes 214a.

As illustrated in FIG. 16D, the second conductive film 4b is formed as a plurality of rectangular regions in the input region 2a first. These rectangular regions make up the pad portions 211a and 212a (large area portions) of the first and second input position detection electrodes 211 and 212. Further, the same film 4b is formed in a region near the edge portion 20e overlapping first and second mounting terminals 24a and 24b. Still further, the same film 4b is formed as the plurality of wires 27 in the outer region 2b. Moreover, the second conductive film 4b is formed as the shielding auxiliary electrode 29 in the regions of the outer region 2b corresponding to the four sides of the substrate 20. Here, the first mounting terminals 24a are connected to the wires 27, and the second mounting terminals 24b to the shielding auxiliary electrode 29.

When the first conductive film 4a, interlayer insulating film 214 and second conductive film 4b, that are configured as described above, are stacked one on top of another, the substrate 20 is configured as illustrated in FIGS. 16A, 17 and 18A to 18C. As a result, the plurality of input position detection electrodes 21 (first and second input position detection electrodes 211 and 212) are formed in the input region 2a.

Further, the two second mounting terminals 24b are formed in the outer region 2b on the first surface 20a of the substrate 20, one on each side of the region where the first mounting terminals 24a are arranged. The first mounting terminals 24a are electrically connected to the wires 27, and the second mounting terminals 24b to the shield electrode 28 on both sides of the region where the first mounting terminals 24a are arranged. The present embodiment is similar in other configurations to embodiment 1. Therefore, the description thereof is omitted.

In the input panel 2 configured as described above, of the first and second conductive films 4a and 4b, the second conductive film 4b on the side opposite to the input operation side is used to form the wires 27. Of the first and second conductive films 4a and 4b, the first conductive film 4a on the input operation side is used to form the shield electrode 28. The same electrode 28 overlaps the wires 27 on the input operation side. This provides the same advantages as in embodiment 1 including shutting out electromagnetic noise trying to find its way into the wires 27 from the input operation side thanks to the shield electrode 28.

Further, the shielding auxiliary electrode 29 is formed to the outside of the outer periphery of the interlayer insulating film 214 at the positions corresponding to the four sides of the substrate 20 as in embodiment 2. Part of the same electrode 29 is exposed from the interlayer insulating film 214. On the other hand, the shield electrode 28 is formed to the outside of the outer periphery of the interlayer insulating film 214 at the positions corresponding to the four sides of the substrate 20. Therefore, the shielding auxiliary electrode 29 covers the side portion 214e on the outer periphery side of the interlayer insulating film 214. The shield electrode 28 is connected to the shielding auxiliary electrode 29 exposed from the interlayer insulating film 214 all along the longitudinal direction of the same electrode 29 on the outer periphery side of the interlayer insulating film 214 (in the region free from the interlayer insulating film 214). This provides substantially reduced resistance of the shield electrode 28. Further, the shield electrode 28 and shielding auxiliary electrode 29 suppress electromagnetic noise from finding its way into the wires 27 from the surrounding environment.

Other Embodiments

In the embodiments described above, only either of the first and second conductive films 4a and 4b is used to form the first and second input position detection electrodes 211 and 212. However, both of the first and second conductive films 4a and 4b may be used to form the same electrodes 211 and 212. For example, the first conductive film 4a may be used to form the first input position detection electrodes 211, and the second conductive film 4b to form the second input position detection electrodes 212.

In the embodiments described above, the first or second conductive film 4a or 4b is used to form the shield electrode 28 on the input operation side for the wires 27. Alternatively, however, the light-shielding layer 90a in the cover 90 shown in FIGS. 2A and 2B may be formed with a conductive film such as chromium and used as a shield electrode.

In the embodiments described above, a liquid crystal device is used as the image generating device 5. Alternatively, however, an organic electroluminescence device may be used as the image generating device 5.

[Examples of Incorporation into Electronic Equipment]

Figure 19A:
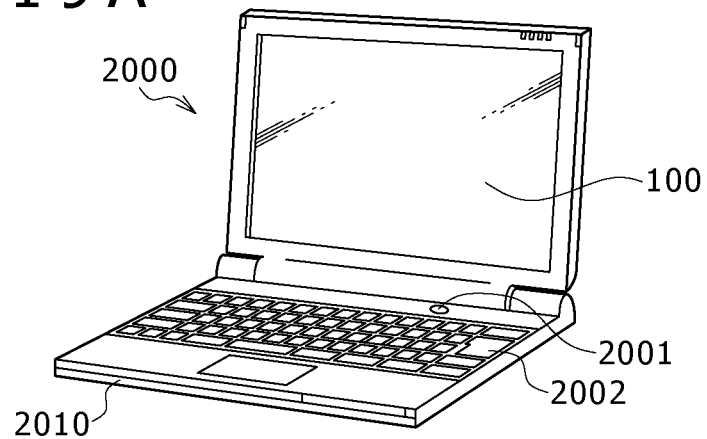
FIGS. 19A to 19C are explanatory diagrams of electronic equipment having the electrostatic capacitance input device of an embodiment.
Figure 19B:
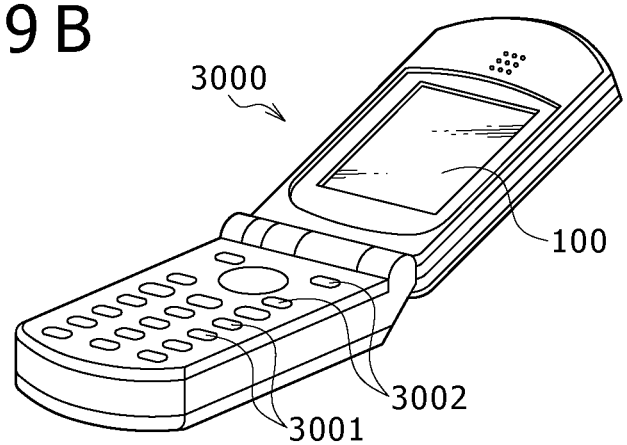
Figure 19C:
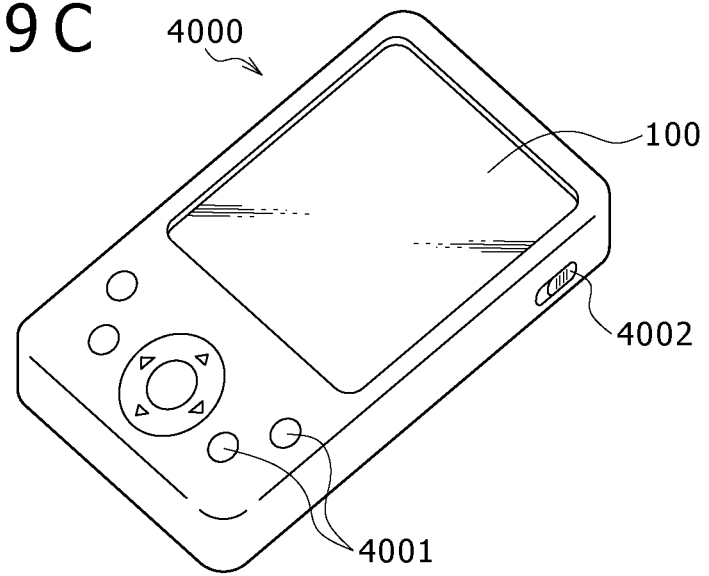

A description will be given next of electronic equipment to which the electro-optical device 100 equipped with an input device according to any one of the embodiments described above is applied. FIG. 19A illustrates the configuration of a laptop personal computer having the electro-optical device 100 equipped with an input device. A personal computer 2000 includes the electro-optical device 100 equipped with an input device as a display unit and a main body section 2010. A power switch 2001 and keyboard 2002 are provided on the main body section 2010. FIG. 19B illustrates the configuration of a mobile phone having the electro-optical device 100 equipped with an input device. A mobile phone 3000 includes a plurality of operation buttons 3001 and scroll buttons 3002 and the electro-optical device 100 equipped with an input device as a display unit. The screen displayed on the electro-optical device 100 equipped with an input device can be scrolled by manipulating the scroll buttons 3002. FIG. 19C illustrates the configuration of a personal digital assistant (PDA) to which the electro-optical device 100 equipped with an input device is applied. A PDA 4000 includes a plurality of operation buttons 4001, a power switch 4002 and the electro-optical device 100 equipped with an input device as a display unit. A variety of information such as address book and schedule book is displayed on the electro-optical device 100 equipped with an input device by manipulating the operation buttons 4001.

It should be noted that electronic equipment to which the electro-optical device 100 equipped with an input device is applied includes not only those illustrated in FIGS. 19A to 19C but also digital still cameras, liquid crystal TV sets, viewfinders and monitor-direct-viewing video tape recorders, car navigators, pagers, electronic organizers, electronic calculators, word processors, workstations, TV phones, POS terminals and bank terminals. The electro-optical device 100 equipped with an input device is applicable as a display section of these various pieces of electronic equipment.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electrostatic capacitance input device comprising:
an input region of a substrate, in which a plurality of input position detection electrodes are provided;
a plurality of wires that are electrically connected to the plurality of input position detection electrodes and extend outside the input region of the substrate;

a shield electrode that overlaps the wires on the input operation side, wherein a first conductive film, interlayer insulating film and second conductive film are formed in this order from the substrate side on the substrate, of the first and second conductive films, at least either of the two conductive films is used to form the input position detection electrodes, of the first and second conductive films, the conductive film on the side opposite to the input operation side is used to form the wires, and of the first and second conductive films, the conductive film on the input operation side is used to form the shield electrode.

2. The electrostatic capacitance input device of claim 1 wherein of the first and second conductive films, the conductive film on the side opposite to the input operation side is used to form a shielding auxiliary electrode on the outer periphery side of the wires on the substrate, and the shielding auxiliary electrode and shield electrode overlap and are electrically connected together in the region free from the interlayer insulating film.

3. The electrostatic capacitance input device of claim 2 wherein the shielding auxiliary electrode is formed along all the sides of the substrate, and the shielding auxiliary electrode and shield electrode overlap and are electrically connected together all along the longitudinal direction of the shielding auxiliary electrode.

4. The electrostatic capacitance input device of claim 1 wherein of the first and second conductive films, at least either of the two conductive films is used to provide first and second mounting terminals outside the input region of the substrate, and the first mounting terminals are connected to the wires, and the second mounting terminals to the shield electrode.

5. The electrostatic capacitance input device of claim 1 wherein of the first and second conductive films, at least either of the two conductive films is used to provide, on the substrate, a plurality of first input position detection electrodes and a plurality of second input position detection electrodes as the input position detection electrodes, the first input position detection electrodes extend in a first direction in an in-plane direction of the substrate, the second input position detection electrodes extend in a second direction that intersects the first direction in an in-plane direction of the substrate, a junction portion, interruption portion and relay electrode are provided at each of the intersecting portions between the first and second input position detection electrodes, the junction portion allows for one of the first and second input position detection electrodes to be continuous and comprises the one of the first and second conductive films, the interruption portion is a portion where the other of the first and second input position detection electrodes is interrupted, the relay electrode overlaps the junction portion via the interlayer insulating film to electrically connect the interruption portion of the other of the first and second input position detection electrodes, and the relay electrode comprises the other of the first and second conductive films.

6. The electrostatic capacitance input device of claim 1 wherein the first conductive film, interlayer insulating film and second conductive film are formed on a substrate surface on the input operation side of the substrate, the wires are formed with the first conductive film, and the shield electrode is formed with the second conductive film.

7. The electrostatic capacitance input device of claim 1 wherein the first conductive film, interlayer insulating film and second conductive film are formed on a substrate surface on the side opposite to the input operation side of the substrate, the wires are formed with the second conductive film, and the shield electrode is formed with the first conductive film.

* * * * *

UNITED STATES PATENT AND TRADEMARK OFFICE
CERTIFICATE OF CORRECTION

PATENT NO. : 8,482,301 B2
APPLICATION NO. : 12/839790
DATED : July 9, 2013
INVENTOR(S) : Takeshi Kurashima It is certified that error appears in the above-identified patent and that said Letters Patent is hereby corrected as shown below:

On the title page item (75), replace

"Takashi Kurashima, Nagano (JP)" with

-- Takeshi Kurashima, Nagano (JP) --

Signed and Sealed this
First Day of July, 2014

Michelle K. Lee
*Deputy Director of the United States Patent and Trademark Office*